United States Patent
Li et al.

(10) Patent No.: US 10,825,523 B2
(45) Date of Patent: Nov. 3, 2020

(54) MULTI-DECKS MEMORY DEVICE INCLUDING INTER-DECK SWITCHES

(71) Applicant: Micron Technology, Inc., Boise, ID (US)

(72) Inventors: Benben Li, Boise, ID (US); Akira Goda, Boise, ID (US); Ramey M. Abdelrahaman, Boise, ID (US); Ian C. Laboriante, Boise, ID (US); Krishna K. Parat, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/667,465

(22) Filed: Oct. 29, 2019

(65) Prior Publication Data
US 2020/0066346 A1    Feb. 27, 2020

Related U.S. Application Data

(62) Division of application No. 15/850,708, filed on Dec. 21, 2017, now Pat. No. 10,475,515.

(51) Int. Cl.
*G11C 16/04* (2006.01)
*H01L 27/11558* (2017.01)
(Continued)

(52) U.S. Cl.
CPC ............ *G11C 16/0475* (2013.01); *G11C 8/08* (2013.01); *G11C 11/4087* (2013.01);
(Continued)

(58) Field of Classification Search
CPC ......... H01L 27/11524; H01L 27/11551; H01L 27/11556; H01L 27/1157; H01L 27/1158
See application file for complete search history.

(56) References Cited

U.S. PATENT DOCUMENTS 8,884,357 B2   11/2014   Wang et al.
9,362,300 B2    6/2016   Lu et al.
(Continued)

FOREIGN PATENT DOCUMENTS

CN    110010175 A    7/2019

OTHER PUBLICATIONS

"Chinese Application Serial No. 201811563899.2, Office Action dated Jan. 21, 2019", w/ English translation, 41 pgs.
(Continued)

*Primary Examiner* — Allison Bernstein
(74) *Attorney, Agent, or Firm* — Schwegman Lundberg & Woessner, P.A.

(57) ABSTRACT

Some embodiments include apparatuses and methods of forming such apparatuses. One of the apparatus includes first memory cells located in different levels in a first portion of the apparatus, second memory cells located in different levels in a second portion of the apparatus, a switch located in a third portion of the apparatus between the first and second portions, first and second control gates to access the first and second memory cells, an additional control gate located between the first and second control gates to control the switch, a first conductive structure having a thickness and extending perpendicular to the levels in the first portion of the apparatus, a first dielectric structure between the first conductive structure and charge-storage portions of the first memory cells, a second dielectric structure having a second thickness between the second conductive structure and a sidewall of the additional control gate, the second thickness being greater than the first thickness.

20 Claims, 26 Drawing Sheets

(51) Int. Cl.
*H01L 27/11524* (2017.01)
*H01L 45/00* (2006.01)
*G11C 11/408* (2006.01)
*H01L 27/24* (2006.01)
*H01L 27/11597* (2017.01)
*G11C 8/08* (2006.01)
*H01L 27/11556* (2017.01)
*H01L 27/11582* (2017.01)
*H01L 27/1157* (2017.01)

(52) U.S. Cl.
CPC .... *H01L 27/1157* (2013.01); *H01L 27/11524* (2013.01); *H01L 27/11556* (2013.01); *H01L 27/11558* (2013.01); *H01L 27/11582* (2013.01); *H01L 27/11597* (2013.01); *H01L 27/2481* (2013.01); *H01L 45/145* (2013.01); *G11C 16/0483* (2013.01)

(56) References Cited

U.S. PATENT DOCUMENTS

| | | |
|---|---|---|
| 9,780,110 B2 | 10/2017 | Tanzawa et al. |
| 10,475,515 B2 | 11/2019 | Li et al. |
| 2019/0198109 A1 | 6/2019 | Li et al. |

OTHER PUBLICATIONS

"Chinese Application Serial No. 201811563899.2, Response filed Feb. 20, 2019 to Office Action dated Jan. 21, 2019", w/o English claims, 54 pgs.

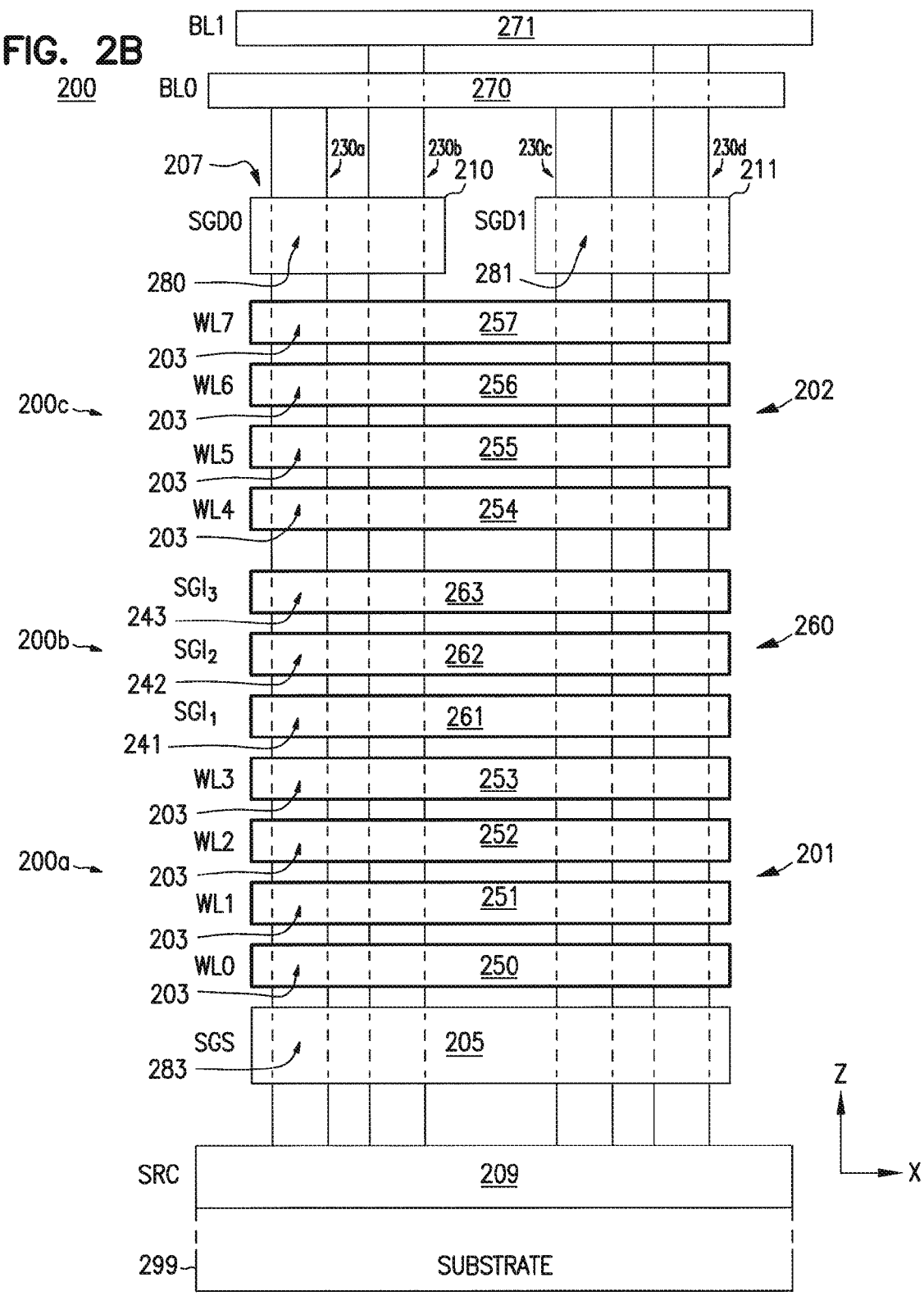

MULTI-DECKS MEMORY DEVICE INCLUDING INTER-DECK SWITCHES

PRIORITY APPLICATION

This application is a divisional of U.S. application Ser. No. 15/850,708, filed Dec. 21, 2017, which is incorporated herein by reference in its entirety.

BACKGROUND

Many electronic systems, such as computers and mobile devices, usually include one or more memory devices to store information. Memory devices include memory cells. Some memory devices may include memory cells arranged in multiple levels of the device. As demand for storage capacity increases, the number of memory cell levels in some memory devices may be increased to accommodate the increased storage capacity. Some conventional memory devices have multiple vertical decks of such memory cell levels, in which such decks are stacked one on top of each other. In some cases, maintaining proper device operations and keeping minimal deviation from existing device fabrication processes to create interconnections in such multiple decks may pose a challenge.

BRIEF DESCRIPTION OF THE DRAWINGS

FIG. 2B shows a representation of a side view of a portion of a structure of the memory device of FIG. 2A, according to some embodiments of the invention.

DETAILED DESCRIPTION

Figure 1:
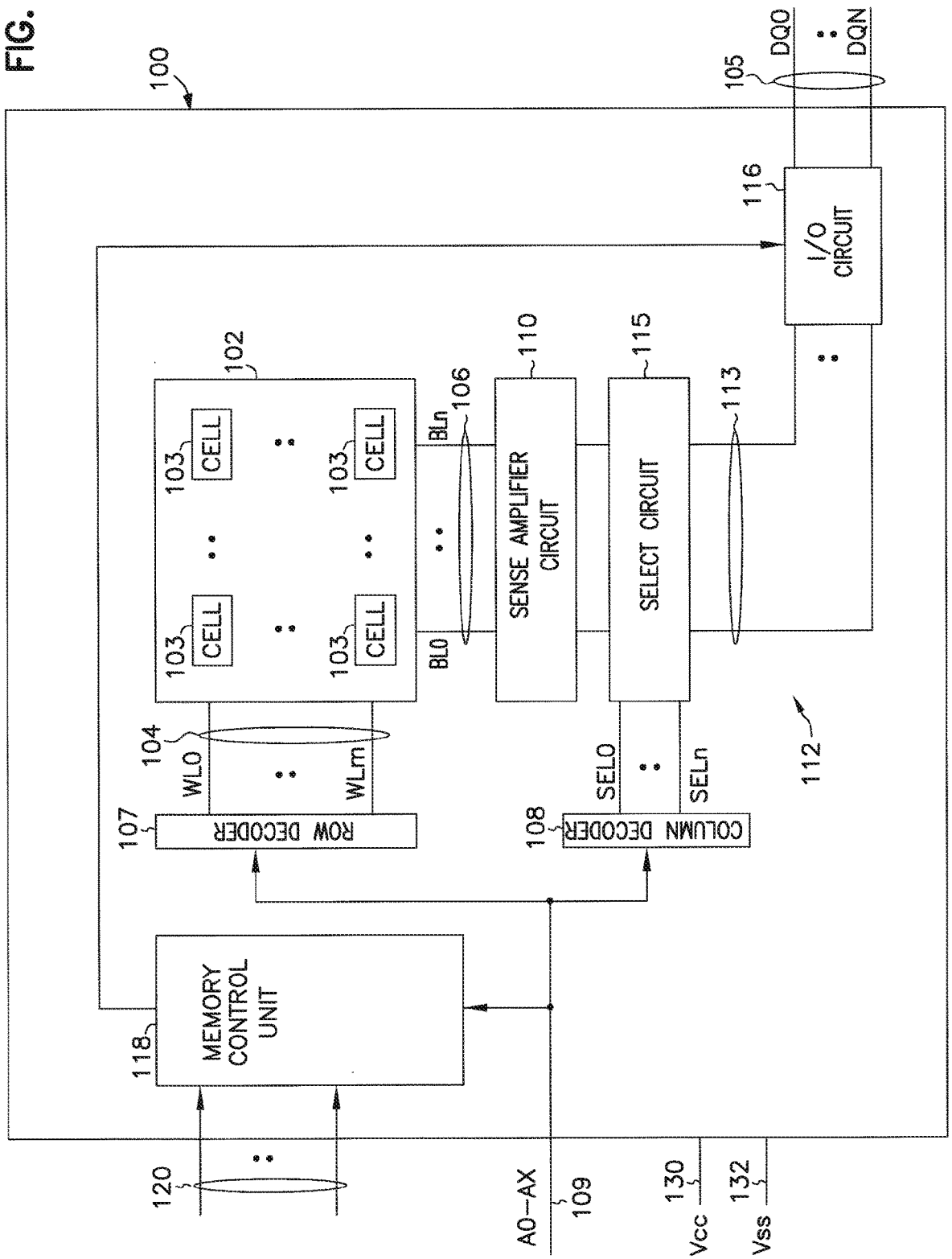
FIG. 1 shows a block diagram of an apparatus in the form of a memory device, according to an embodiment of the invention.

FIG. 1 shows a block diagram of an apparatus in the form of a memory device 100, according to an embodiment of the invention. Memory device 100 can include a memory array 102 having a number of memory cells 103. Memory cells 103 can be arranged in rows and columns along with access lines 104 (e.g., word lines to conduct signals WL0 through WLm) and data lines 106 (e.g., bit lines to conduct signals BL0 through BLn). Memory device 100 can use access lines 104 and data lines 106 to transfer information to and from memory cells 103. A row decoder 107 and a column decoder 108 decode address signals A0 through AX on address lines 109 to determine which ones of memory cells 103 are to be accessed.

A sense amplifier circuit 110 operates to determine the value of information read from memory cells 103 and transmits the information in the form of signals to data lines 106. Sense amplifier circuit 110 can also use the signals on data lines 106 to determine the values of information to be written to memory cells 103.

Memory device 100 is further shown to include circuitry 112 to transfer information between memory array 102 and input/output (I/O) lines 105. Signals DQ0 through DQN on I/O lines 105 can represent information read from or to be written into memory cells 103. I/O lines 105 can include nodes within memory device 100 (or alternatively, pins, solder balls, or other interconnect technologies such as controlled collapse chip connections (C4), or flip chip attach (FCA)) on a package where memory device 100 can reside. Other devices external to memory device 100 (e.g., a memory controller or a processor, not shown in FIG. 1) can communicate with memory device 100 through I/O lines 105, address lines 109, or control lines 120.

Memory device 100 can perform memory operations, such as a read operation, to read information from selected ones of memory cells 103; and a write operation (e.g., a programming operation) to store (e.g., to program) information in selected ones of memory cells 103. Memory device 100 can also perform an erase operation to clear information from some or all of memory cells 103. A memory control unit 118 controls memory operations based on signals present on control lines 120. Examples of the signals presented on control lines 120 can include one or more clock signals and other signals to indicate which operation (e.g., read, write, or erase operation) memory device 100 can or should perform. Other devices external to memory device 100 (e.g., a processor or a memory controller) can control the values of control signals on control lines 120. Specific combinations of values of the signals on control lines 120 can produce a command (e.g., a write, read, or erase command) that can cause memory device 100 to perform a corresponding memory operation (e.g., a write, read, or erase operation).

Each of memory cells 103 can be programmed to a different one of at least two data states to represent, for example, a value of a single bit or a value of multiple bits such as two, three, four, or a higher number of bits. For example, each of memory cells 103 can be programmed to one of two data states to represent a binary value of "0" or "1" of a single bit. Such a cell is sometimes called a single level cell. In another example, each of memory cells 103 can be programmed to one of more than two data states to represent a value of, for example, multiple bits, such as one of four possible values "00," "01," "10," and "11" of two bits, one of eight possible values "000," "001," "010," "011," "100," "101," "110," and "111" of three bits, or one of another set of values of multiple bits. A cell that can be programmed to more than two data states is sometimes referred to as a multi-level cell (or multi-state cell). Different operations on these types of cells are discussed in more detail, below.

Memory device 100 can receive a supply voltage, including supply voltage signals $V_{cc}$ and $V_{ss}$, on a supply line 130 and a supply line 132, respectively. Supply voltage signal $V_{ss}$ can, for example, be at a ground potential (e.g., having a value of approximately zero volts). Supply voltage signal $V_{ss}$ can also operate at other voltages. Supply voltage signal $V_{cc}$ can include an external voltage supplied to memory device 100 from an external power source such as a battery or an alternating-current to direct-current (AC-DC) converter circuitry (not shown in FIG. 1).

Circuitry 112 of memory device 100 is further shown to include a select circuit 115 and an I/O circuit 116. Select circuit 115 can respond to signals SEL1 through SELn to select signals on data lines 106 and 113 to represent the information read from or to be programmed into memory cells 103. Column decoder 108 can selectively activate the SEL1 through SELn signals based on the A0 through AX address signals on address lines 109. Select circuit 115 can select the signals on data lines 106 and 113 to provide communication between memory array 102 and I/O circuit 116 during read and write operations.

Memory device 100 can include a non-volatile memory device and memory cells 103 can include non-volatile memory cells, such that memory cells 103 can retain information stored therein when power (e.g., $V_{cc}$, $V_{ss}$, or both) is disconnected from memory device 100.

Each of memory cells 103 can include a memory element having material, at least a portion of which can be programmed to a desired data state (e.g., by storing a corresponding amount of charge on a charge-storage structure, such as a floating gate or charge trap). Different data states can thus represent different values of information programmed in each of memory cells 103.

Memory device 100 can perform a write operation when it receives (e.g., from an external processor or a memory controller) a write command and a value of information to be programmed into one or more selected ones of memory cells 103. Based on the value of the information, memory device 100 can program the selected memory cells to appropriate data states to represent the values of the information to be stored therein.

One of ordinary skill in the art may recognize that memory device 100 may include other components, at least some of which are discussed herein. However, several of these components are not necessarily shown in the figure, so as not to obscure the embodiments described. Memory device 100 may include devices and memory cells, and operate using memory operations (e.g., read, write, and erase operations) similar to, or identical to, those described below with reference to FIG. 2A through FIG. 6G.

Figure 2A:
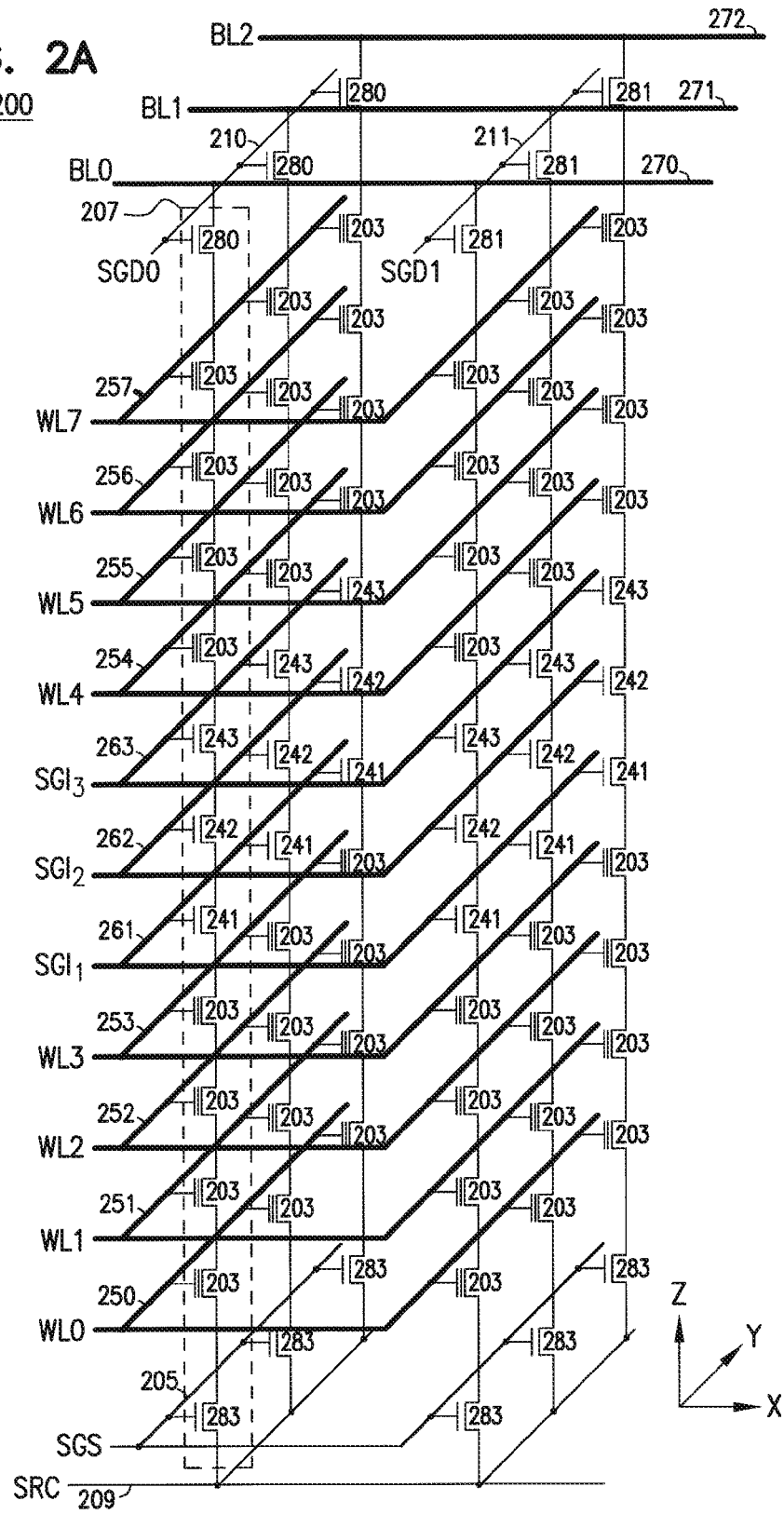
FIG. 2A shows a schematic diagram of a memory device including memory cells and switches, according to some embodiments of the invention.

FIG. 2A shows schematic diagram of a memory device 200 including memory cells 203 and switches 241, 242, and 243, according to an embodiment of the invention. Memory device 200 can include data lines 270, 271, and 272 (e.g., bit lines) that can conduct corresponding signals BL0, BL1, and BL2. Data lines 270, 271, and 272 can correspond to data lines 106 of FIG. 1. FIG. 2A shows memory device 200 having three data lines 270, 271, and 272 as an example. However, the number of data lines can vary.

Memory device 200 can include select lines (e.g., drain-side select lines) 210 and 211, a select line (e.g., source-side select line) 205, and a source (e.g., source line) 209 that can conduct a signal SRC. Select lines 210 can conduct a signal SGD0 to control (e.g., turn on or turn off) select transistors 280. Select line 211 can conduct a signal SGD1 to control (e.g., turn on or turn off) select transistors 281. Select line 205 can conduct a signal SCS to control (e.g., turn on or turn off) select transistors 283.

Memory device 200 can include control gates 250 through 257 and 261, 262, and 263 (e.g., 11 control gates). FIG. 2A shows memory device 200 having 11 control gates as an example. However, the number of control gates can vary.

Control gates 250 through 257 can be part of access lines (e.g., word lines) of memory device 200. Control gates 250 through 257 can respond to signals WL0 though WL7, respectively, to access memory cells 203. Control gates 261, 262, and 263 can respond to signals (interface select gate signals) $SGI_1$, $SGI_2$, and $SGI_3$, respectively, to control (e.g., turn on or turn off) corresponding switches 241, 242, and 243.

Each of control gates 261, 262, and 263 can have an insulated transistor-gate structure (or another type of insulated gate structure), such that each of switches 241, 242, and 243 can operate as a transistor (e.g., a field effect transistor (FET), such as a metal-oxide-semiconductor (MOS) transistor). For example, during an operation (e.g., write, read, or erase) of memory device 200, different voltages can be provided to signals $SGI_1$, $SGI_2$, and $SGI_3$ to control (e.g., turn on or turn off) switches 241, 242, and 243, depending on the operation write, read, or erase) memory device 200.

Memory cells 203 and switches 241, 242, and 243 can be organized in different strings (e.g., strings including memory cells) between source 209 and each of data lines 270, 271, and 271. For example, FIG. 2A shows string 207 including a vertical group of memory cells 203 and a vertical group of switches 241, 242, and 243 coupled between source 209 and data line 270. Switches 241, 242, and 243 can have the same structures (e.g., MOS transistor structure). FIG. 2A shows memory device 200 having six strings as an example (e.g., two strings coupled to a respective data line among data lines 270, 271, and 272). However, the number of strings can vary. Each of switches 241, 242, and 243 can have a structure different from (or alternatively the same as) the structure of memory cells 203. Switches 241, 242, and 243 may conduct current (e.g., electrons or holes) in corresponding strings during operations of memory device 200. For example, in string 207, switches 241, 242, and 243 can be controlled (e.g., turned on) to conduct current in string 207 between source 209 and data line 270.

In operation (e.g., read, write, or erase operation), memory device 200 may apply different biases (e.g., different voltages) to control gates 250 through 257, depending on which operation is being performed and which of memory cells 203 are selected and deselected (unselected) for the operation. Applying such different biases can be similar to those of memory devices (e.g., NAND flash memory) known to those skilled in the art.

In operation (e.g., read, write, or erase operation), memory device 200 may apply the same bias (e.g., the same voltage) to control gates 261, 262, and 263 to control switches 241, 242, and 243. Memory device 200 may apply a voltage to control gates 261, 262, and 263 in order to control (e.g., turn on) switches 241, 242, and 243, and another voltage to control gates 261, 262, and 263 in order to control (e.g., turn off) switches 241, 242, and 243 in another operation of memory device 200. For example, memory device 200 can apply voltages to control gates 261, 262, and 263, such that a conductive path (e.g., a channel) can be created when conductivity through switches 241, 242, and 243 is needed in an operation (e.g., read or write) of memory device 200 and shutdown during another operation an erase operation).

Control gates 261, 262, and 263 can be electrically coupled to each other. Thus, the same driver can be used to provide the same voltage to signals $SGI_1$, $SGI_2$, and $SGI_3$ during an operation of memory device 200. Memory device 200 can have different drivers for control gates 250 through 257 control gates 261, 262, and 263. For example, memory device 200 can have one set of drivers for control gates 250 through 257, and another the set of drivers (or alternatively a single driver) for control gates 261, 262, and 263.

FIG. 2B shows a representation of a side view of a portion of a structure of memory device 200 of FIG. 2A, according to an embodiment of the invention. For simplicity, FIG. 2B shows only two data lines 270 and 271 and four strings (including string 207) of FIG. 2A. As shown in FIG. 2B memory cells 203, switches 241, 242, and 243 and control gates 250 through 257 can be located in different levels of memory device 200 in the z-direction. The z-direction can be perpendicular to (formed vertically with respect to) source 209 and perpendicular to (formed vertically with respect to) a substrate (e.g., a semiconductor substrate), such as substrate 299, located below source 209, over which other components (e.g., memory cells 203 and switches 241, 242, and 243) are formed (e.g., formed vertically (in the z-direction) with respect to source 209). For simplicity, FIG. 2B omits dielectric materials that are interleaved with control gates 250 through 257, 261, 262, and 263.

As shown in FIG. 2B, control gates 250 through 253 (associated with signals WL0 through WL3) and memory cells 203 controlled by control gates 250 through 253 can be located in a portion 200a (e.g., located in a deck 201) of memory device 200. Control gates 254 through 257 (associated with signals WL4 through WL7) and memory cells 203 controlled by control gates 254 through 257 can be located in a portion 200c (e.g., located in a deck 202) of memory device 200. Switches 241, 242, and 243 controlled by control gates 261, 262, and 263 can be located in a portion 200b (e.g., located in an interface 260) between portions 200a and 200c.

FIG. 2B also shows four pillars 230a, 230b, 230c, and 230d associated with four strings (not labeled) of memory device 200. Each of pillars 230a, 230b, 230c, and 230d can have length extending in the z-direction (e.g., extending perpendicular to substrate 299. Each of pillars 230a, 230b, 230c, and 230d can contain materials (e.g., materials filled in a respective opening (e.g., hole) that contain a portion of a respective pillar) extending through control gates 250 through 257, 261, 262, and 263. At least one of the materials in each of pillars 230a, 230b, 230c, and 230d can include a conductive structure (e.g., conductive materials) configured to operate as a channel (e.g., a structure formed from conductive material) to conduct current between source 209 and one of data lines 270, 271, and 272 during an operation of memory device 200.

During an erase operation, the voltage (e.g., 10V provided by signals $SGI_1$, $SGI_2$, and $SGI_3$) applied to each of control gates 261, 262, and 263 (associated respective switches 241, 242, and 243) can be greater than (e.g., more positive than) the voltage (e.g., 0V provided by signals WL0 through WL7) applied to control gates 250 through 257 (associated with memory cells 203). During an erase operation, the voltage (e.g., $V_{ERASE}$=20V) applied to data lines 270, 271, and 272 and source 209 can be greater than the voltage (e.g., 15V) applied to select lines 205, 210, and 211.

During a write operation, the voltage e.g., 10V provided by signals $SGI_1$, $SGI_2$, and $SGI_3$) applied to each of control gates 261, 262, and 263 (associated with respective switches 241, 242, and 243) can be the same as the voltage (e.g., 10V) applied to deselected (e.g., unselected) control gates among control gates 250 through 257. During a write operation, the voltage applied to the selected control gate (e.g., $V_{PGR}$=20V) can be greater than the voltages applied to deselected control gates among control gates 250 through 257. Data lines 270, 271, and 272, select lines 205, 210, and 211, and source 209 can be provided with voltages similar to voltages known to those skilled in the art.

During a read operation (or a write verify operation), the voltage (e.g., 8V) applied to control gates 261, 262, and 263 can be the same as the voltage (e.g., 8V) applied to a deselected control gates among control gates 250 through 257. During a read operation (or a write verify operation), the voltage applied to the selected control gate among control gates 250 through 257 (e.g., $V_{READ}$=1V) can be less than the voltage applied to the deselected control gates among control gates 250 through 257. Data lines 270, 271, and 272, select lines 205, 210, and 211, and source 209 can be provided with voltages similar to voltages known to those skilled in the art.

The structure of memory device 200 (e.g., FIG. 2A and FIG. 2B) can be formed using a deck-by-deck process. For example, in FIG. 29, control gates 250 through 253 and associated memory cells 203 (located in the same levels as control gates 250 through 253) can be formed in a bottom deck (e.g., deck 201) of memory device 200. Control gates 261, 262, and 263 and associated switches 241, 242, and 243 (located in the same levels as control gates 261, 262, and 263) can be formed in interface 260 over deck 201. Control gates 254 through 257 and associated memory cells 203 (located in the same levels as control gates 254 through 257) can be formed over interface 260.

Memory device 200 of FIG. 2B can be formed by processes similar to, or identical to, the processes of memory device 300 described below with reference to FIG. 3A through FIG. 3T.

Figure 3A:
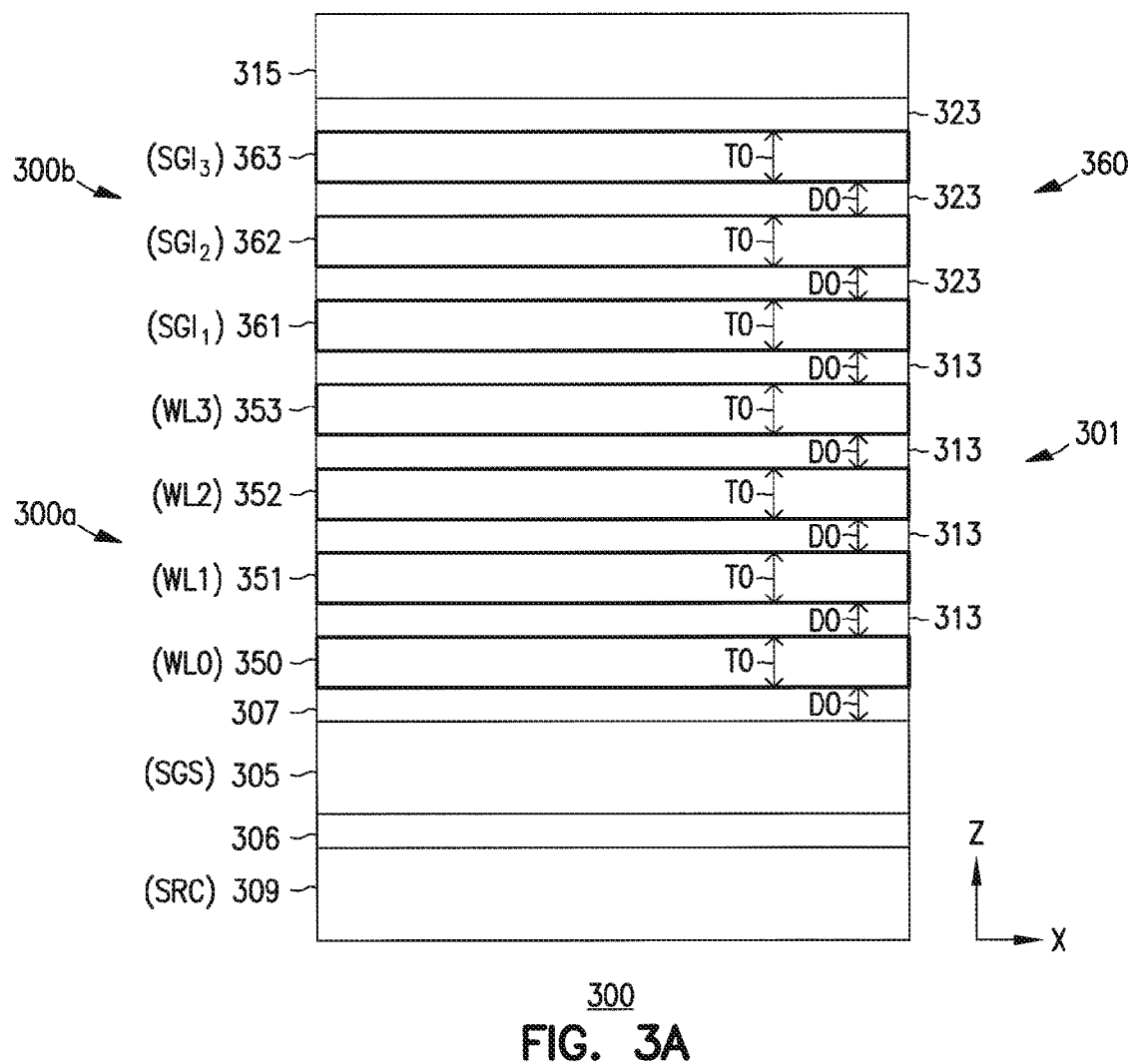
FIG. 3A through FIG. 3T show different portions of fabrication processes of forming a memory device, according to some embodiments of the invention.
Figure 3B:
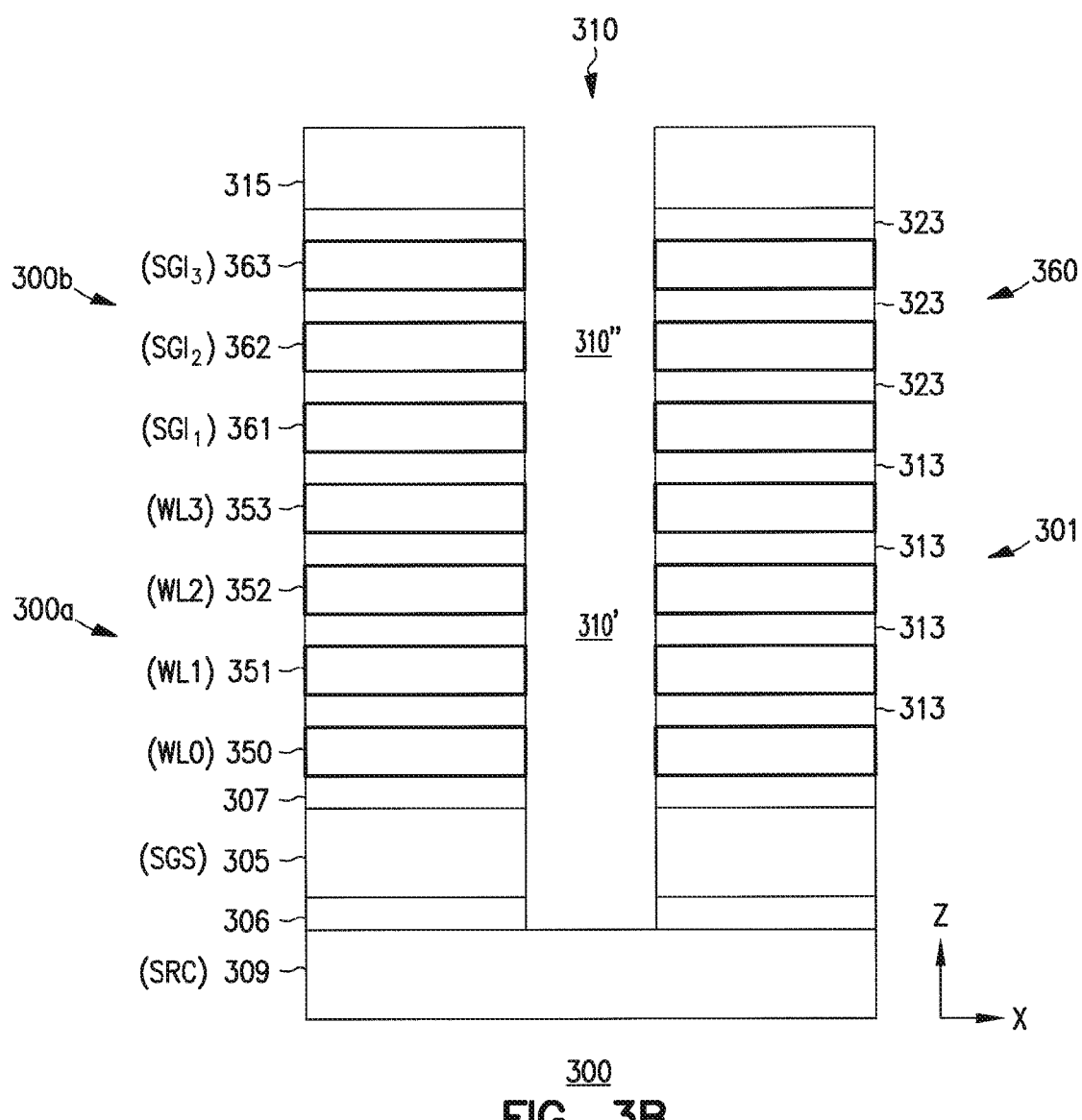
Figure 3C:
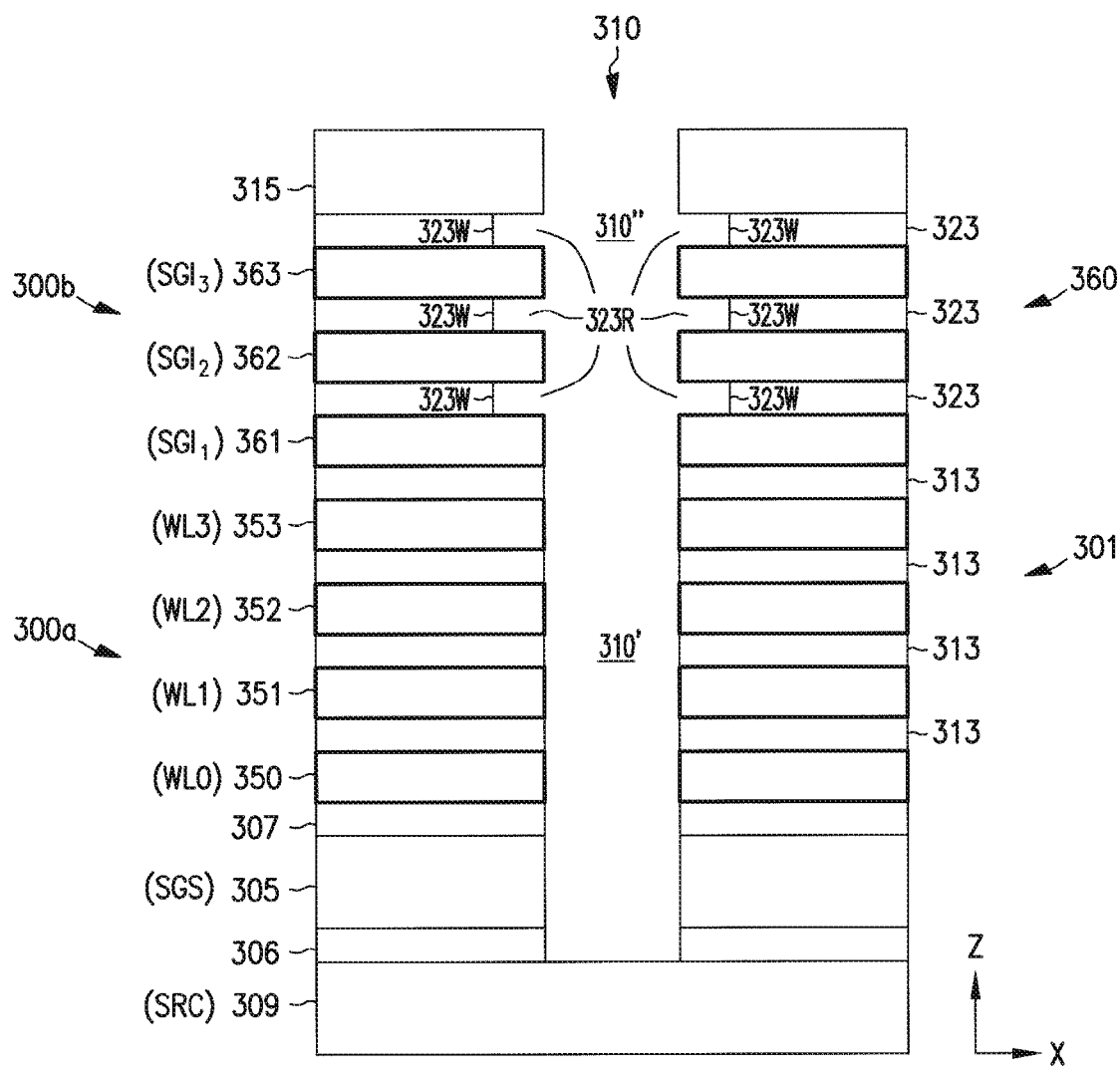
Figure 3D:
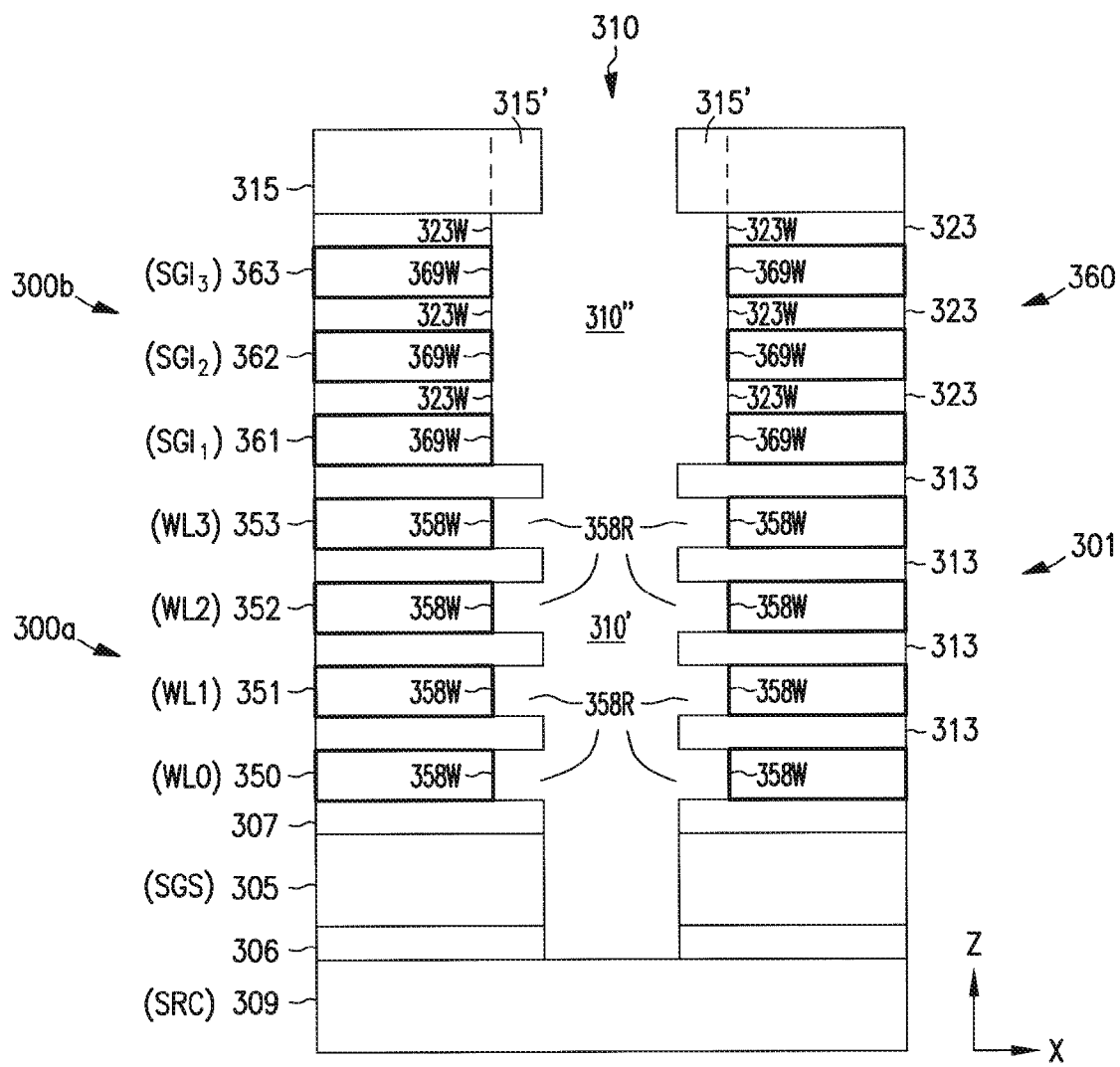
Figure 3E:
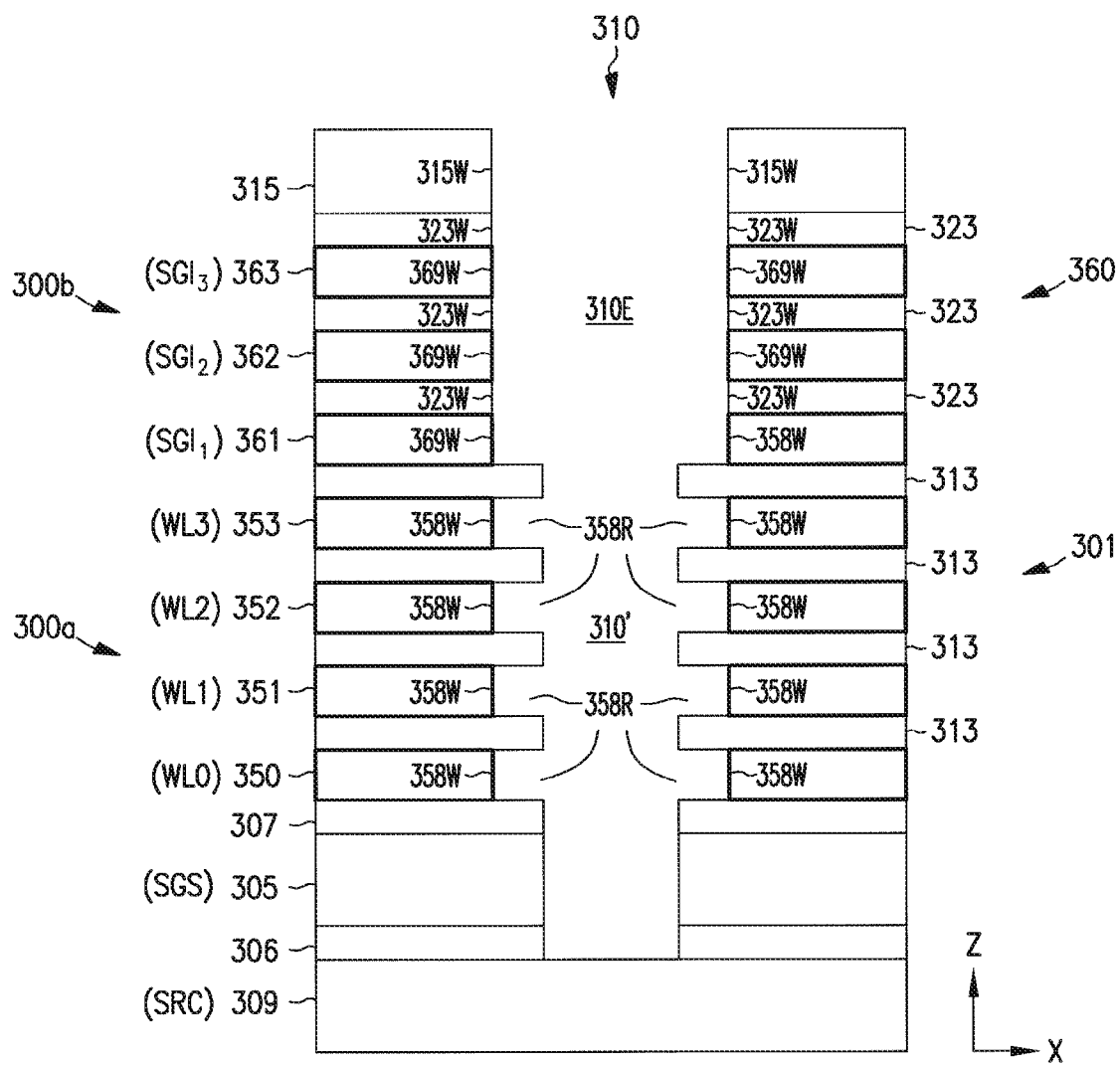
Figure 3F:
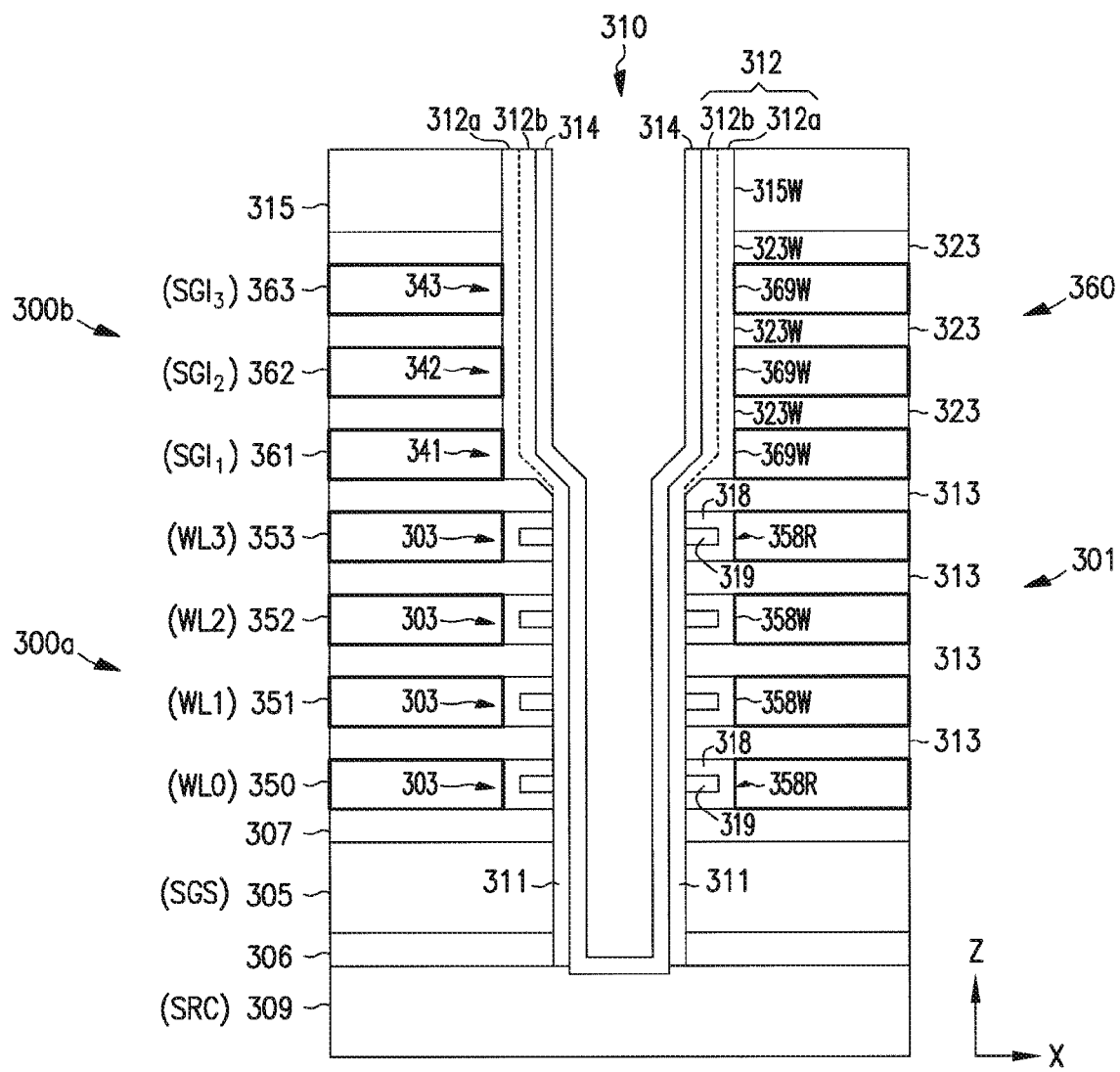
Figure 3G:
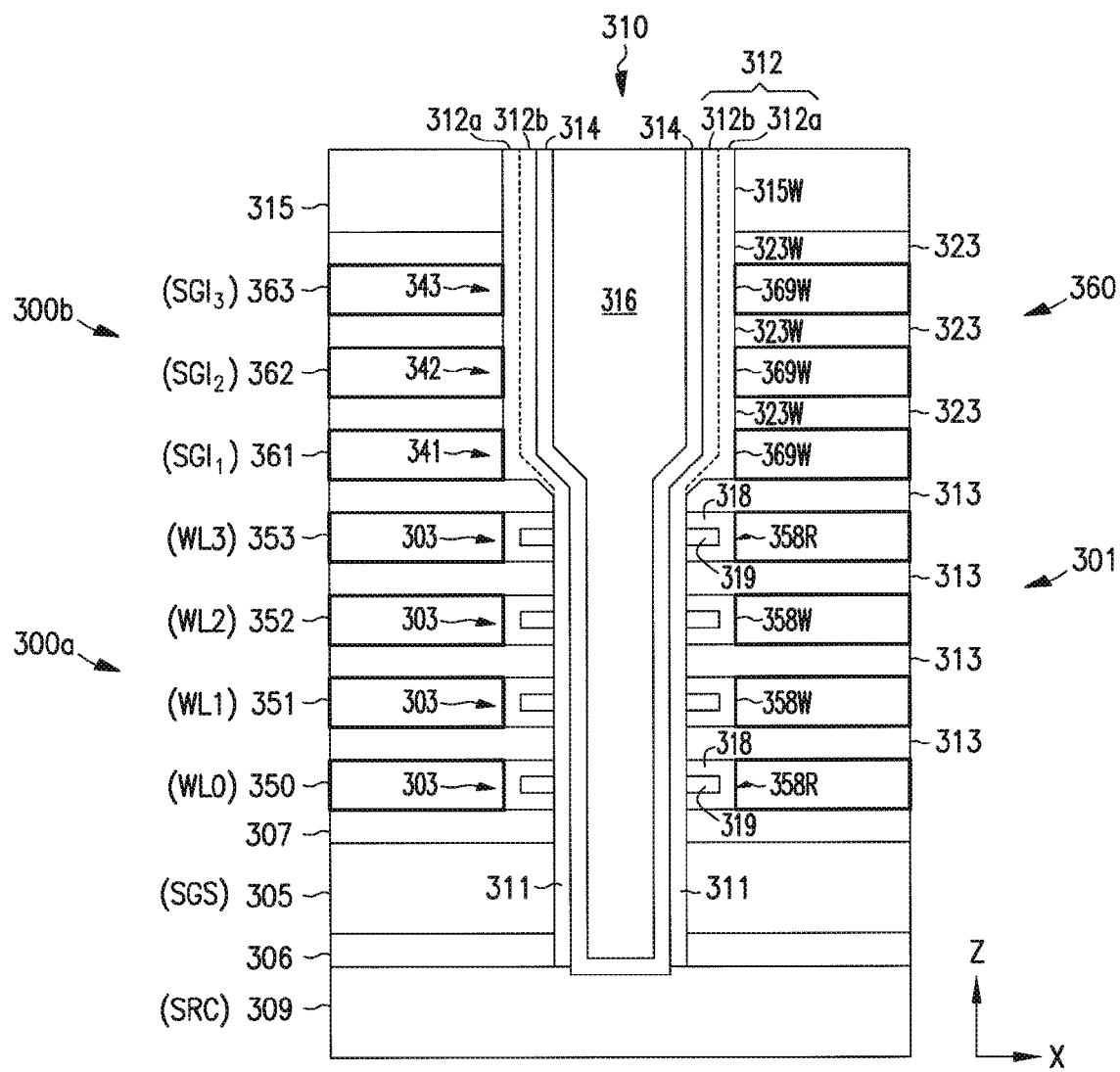
Figure 3H:
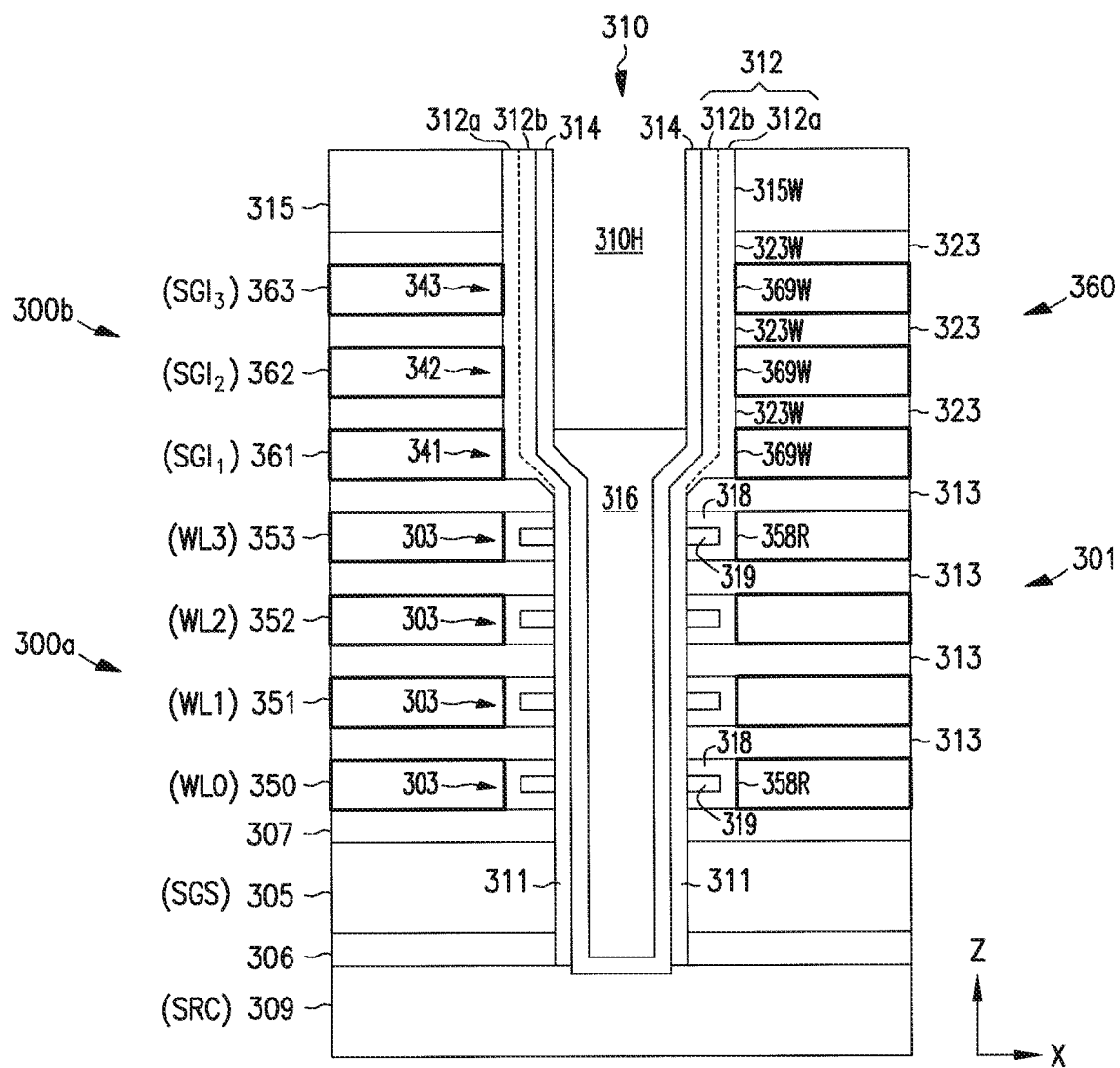
Figure 31:
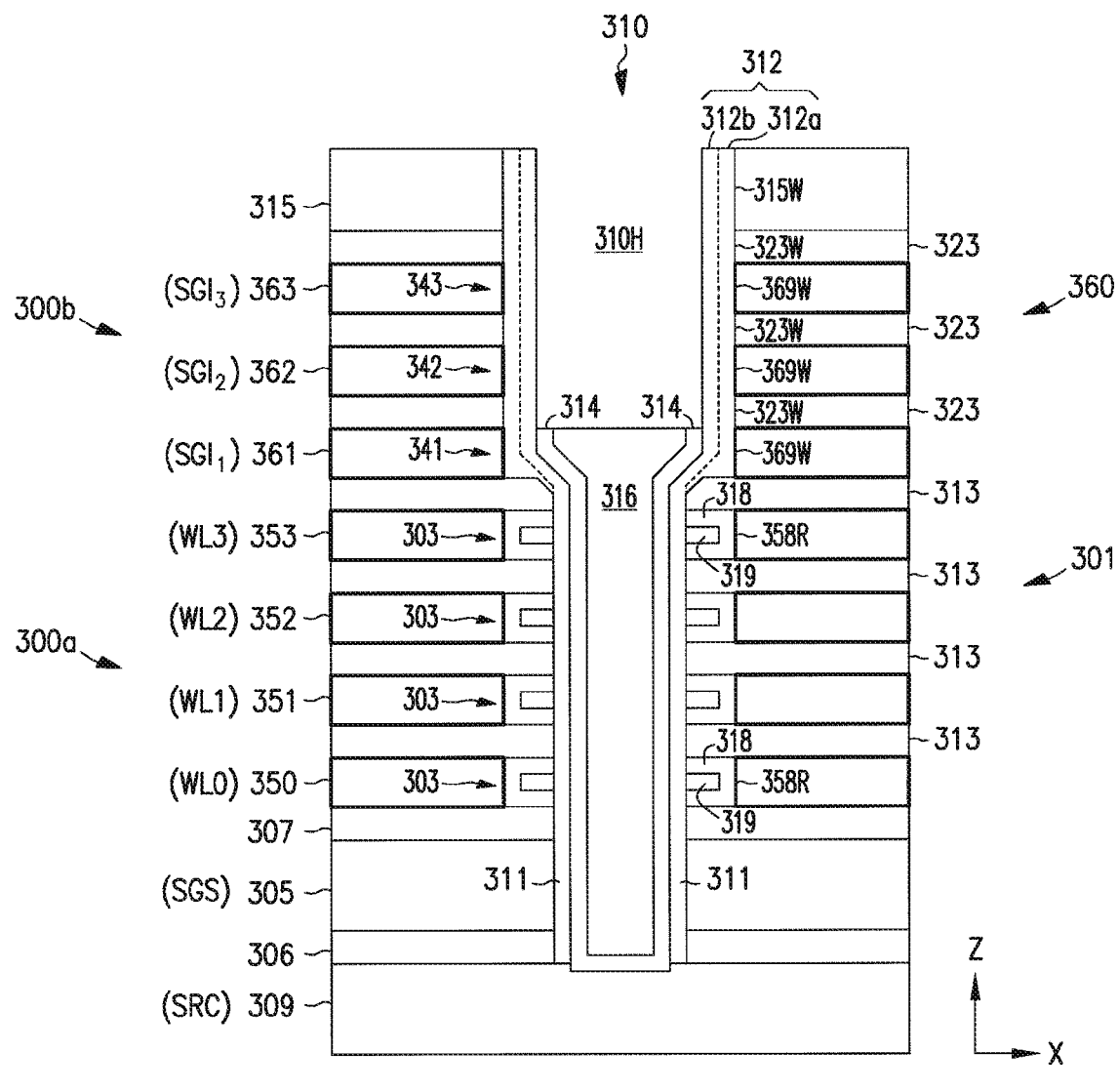
Figure 3J:
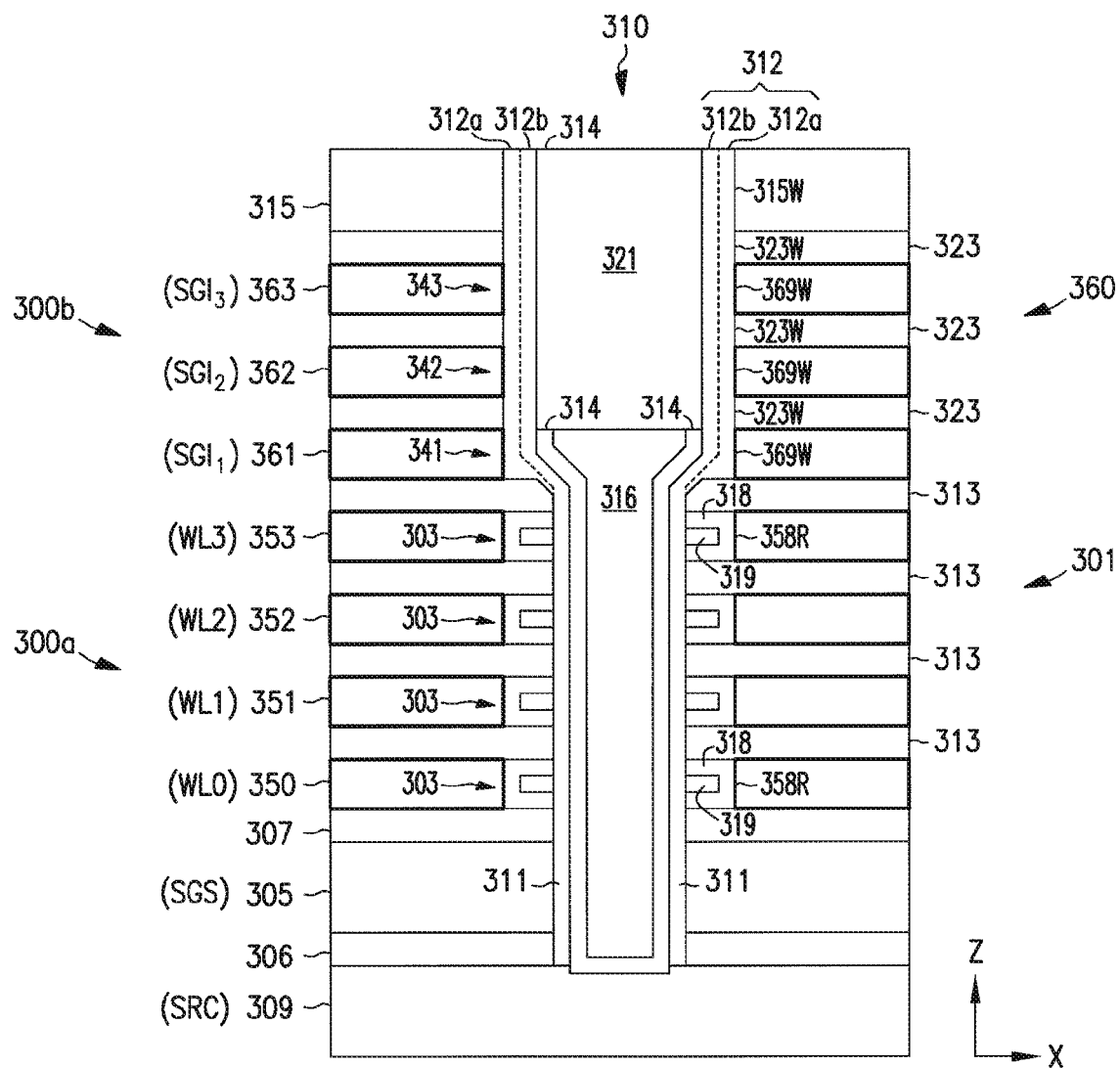
Figure 3K:
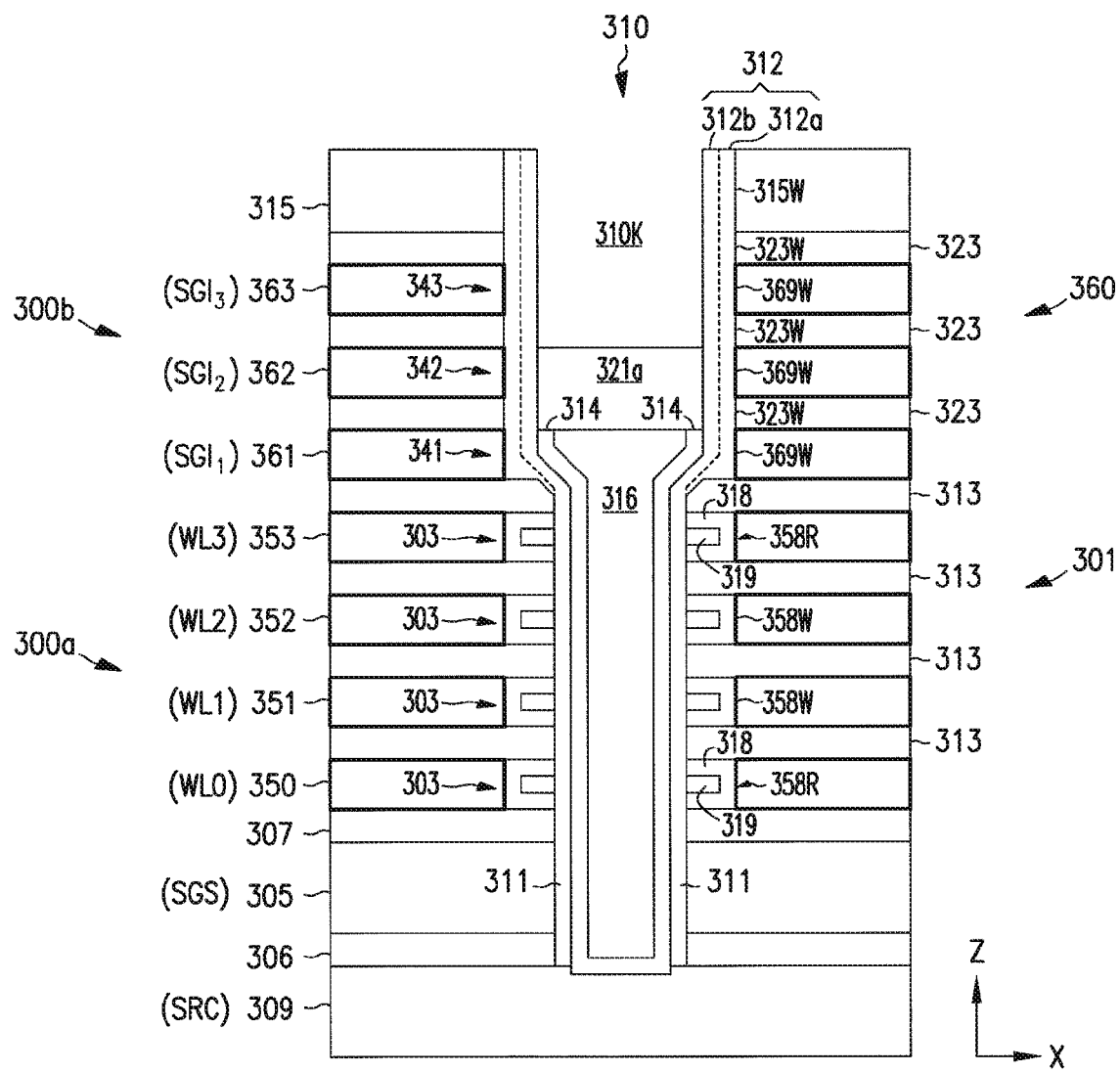
Figure 3L:
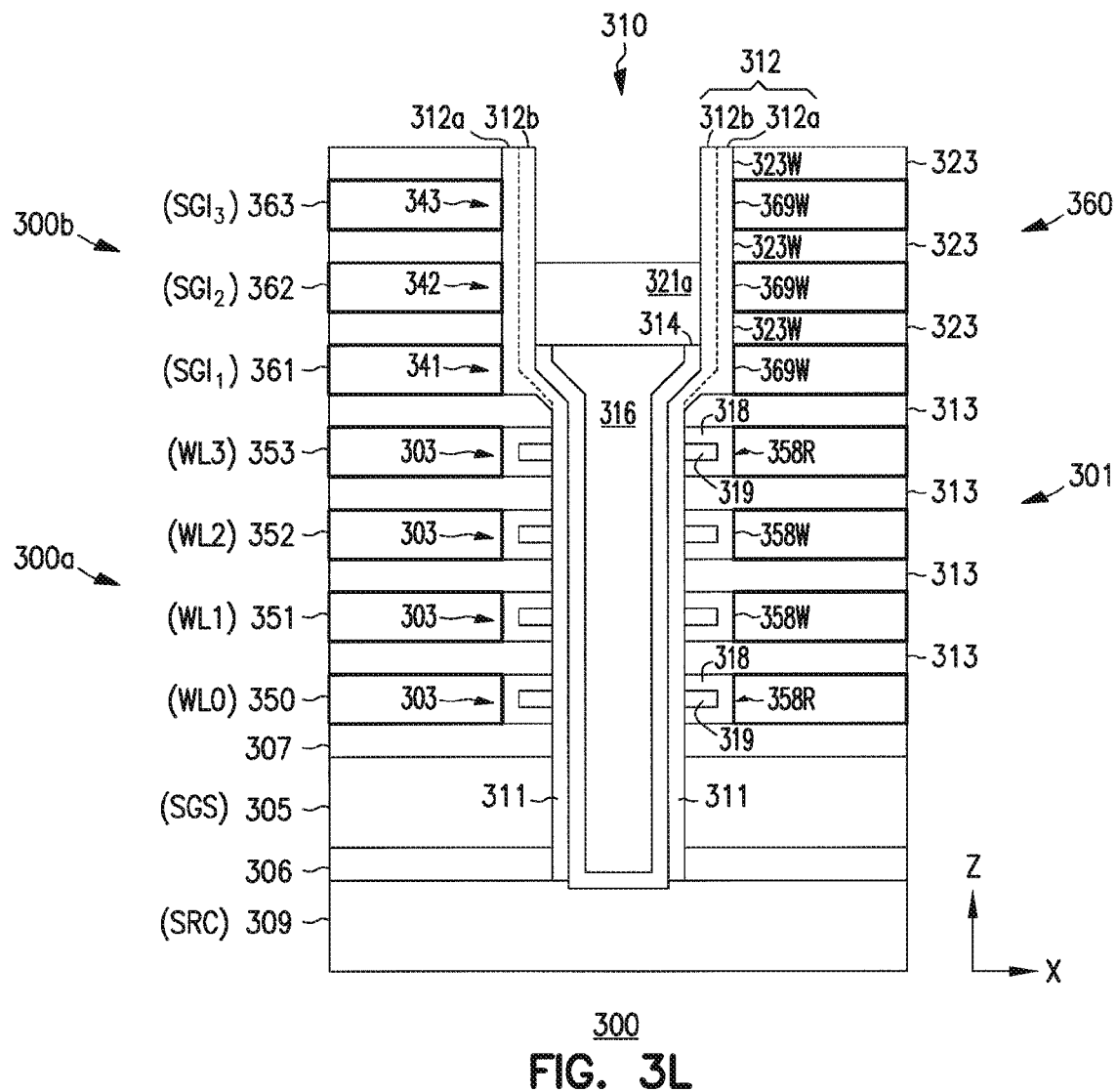
Figure 3M:
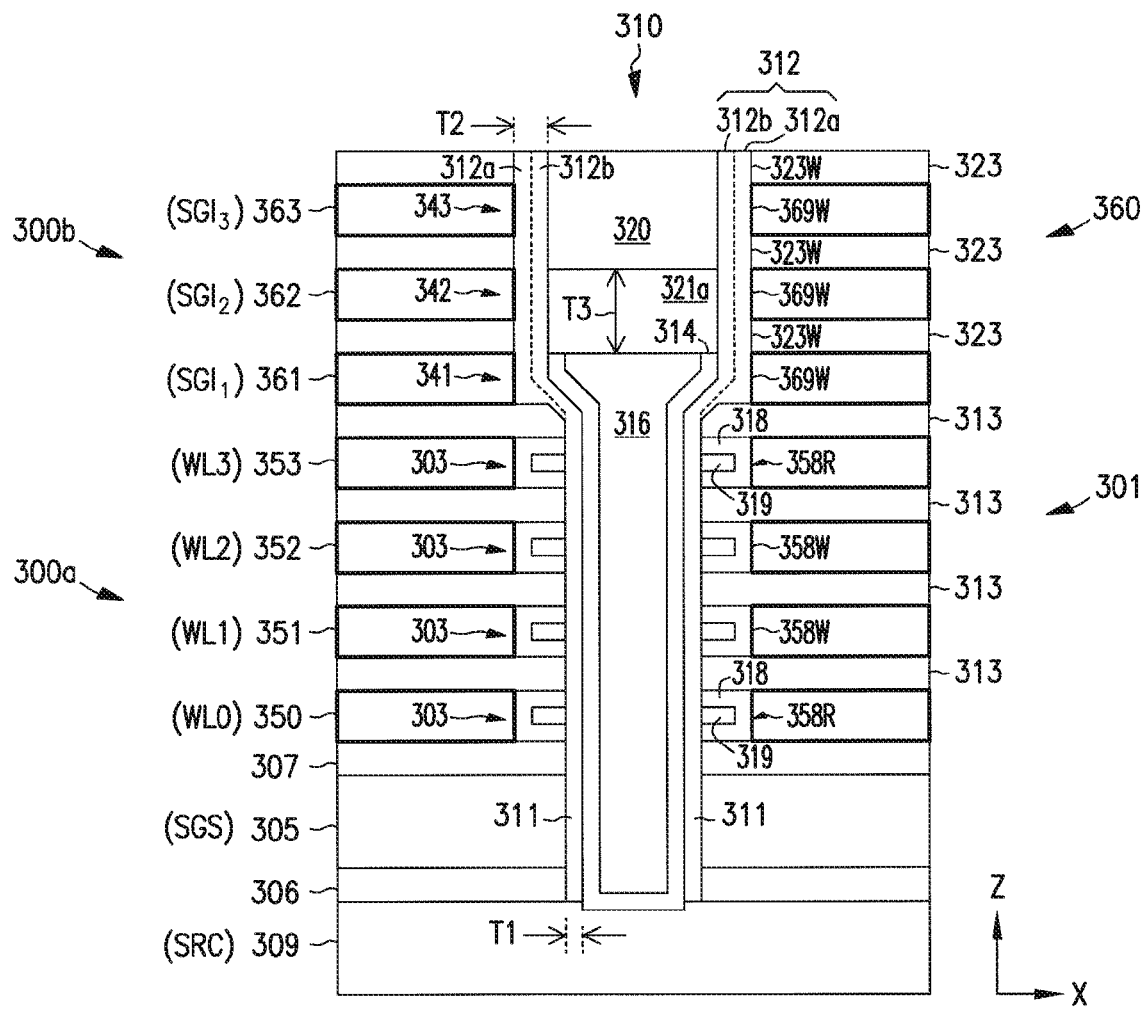
Figure 3N:
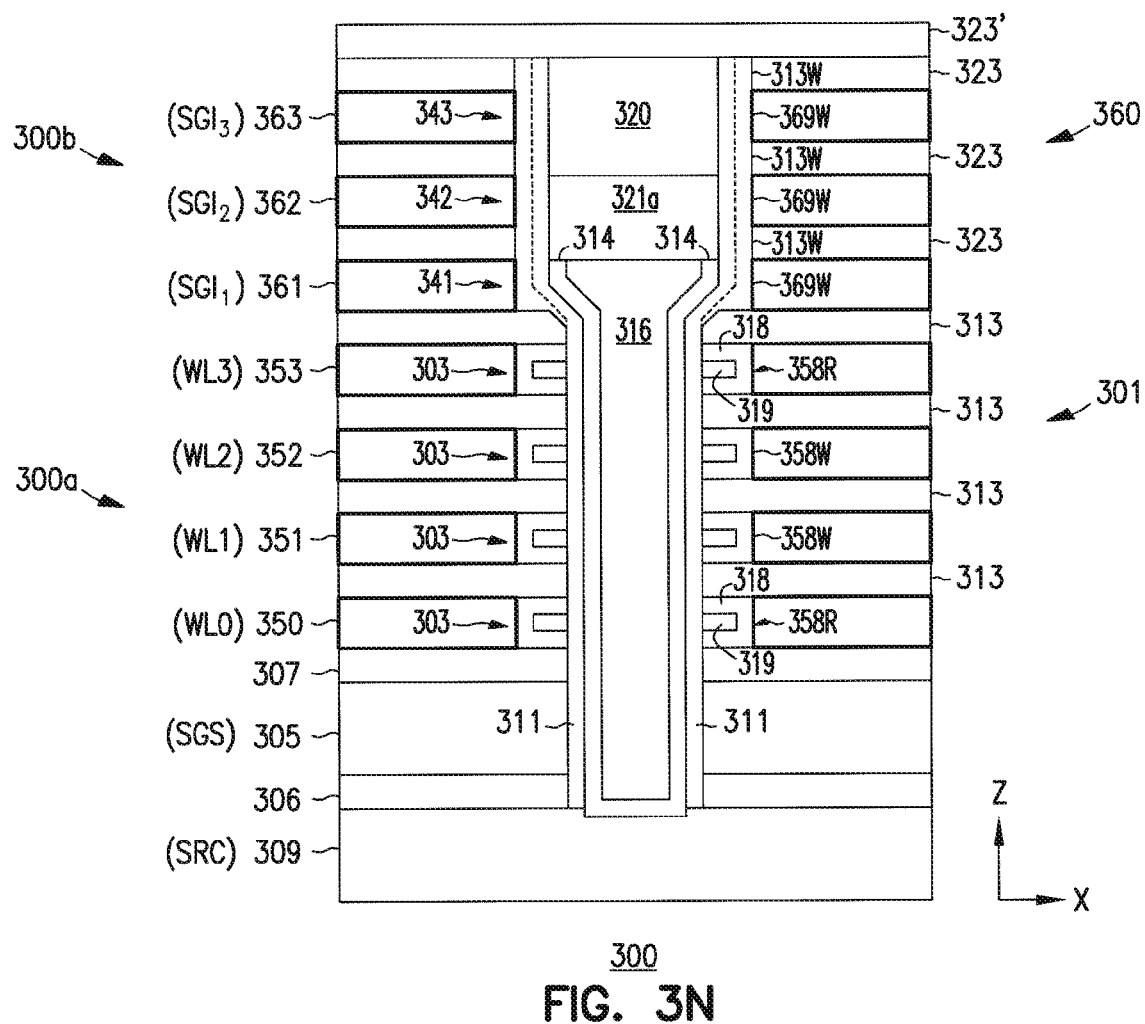
Figure 30:
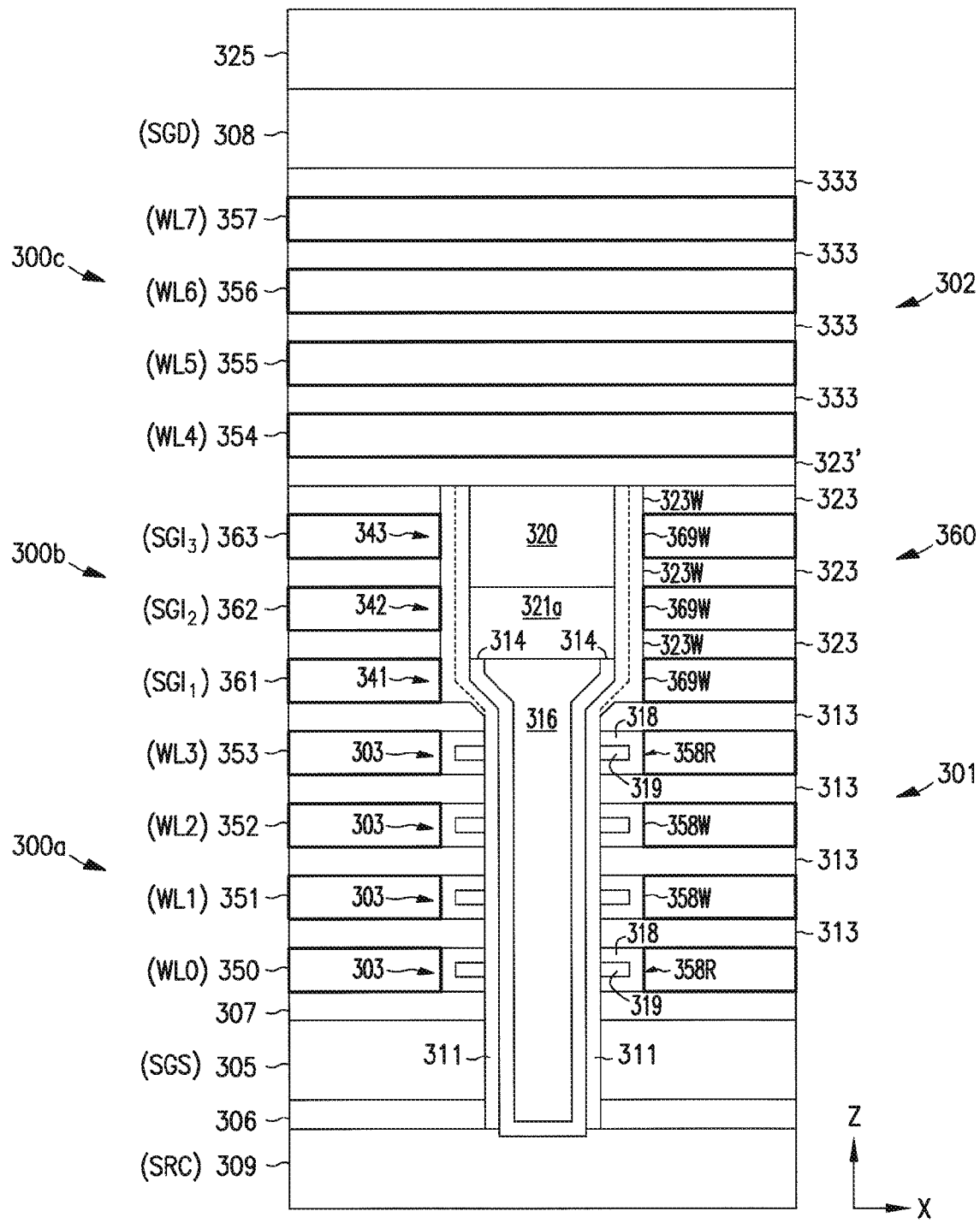
Figure 3P:
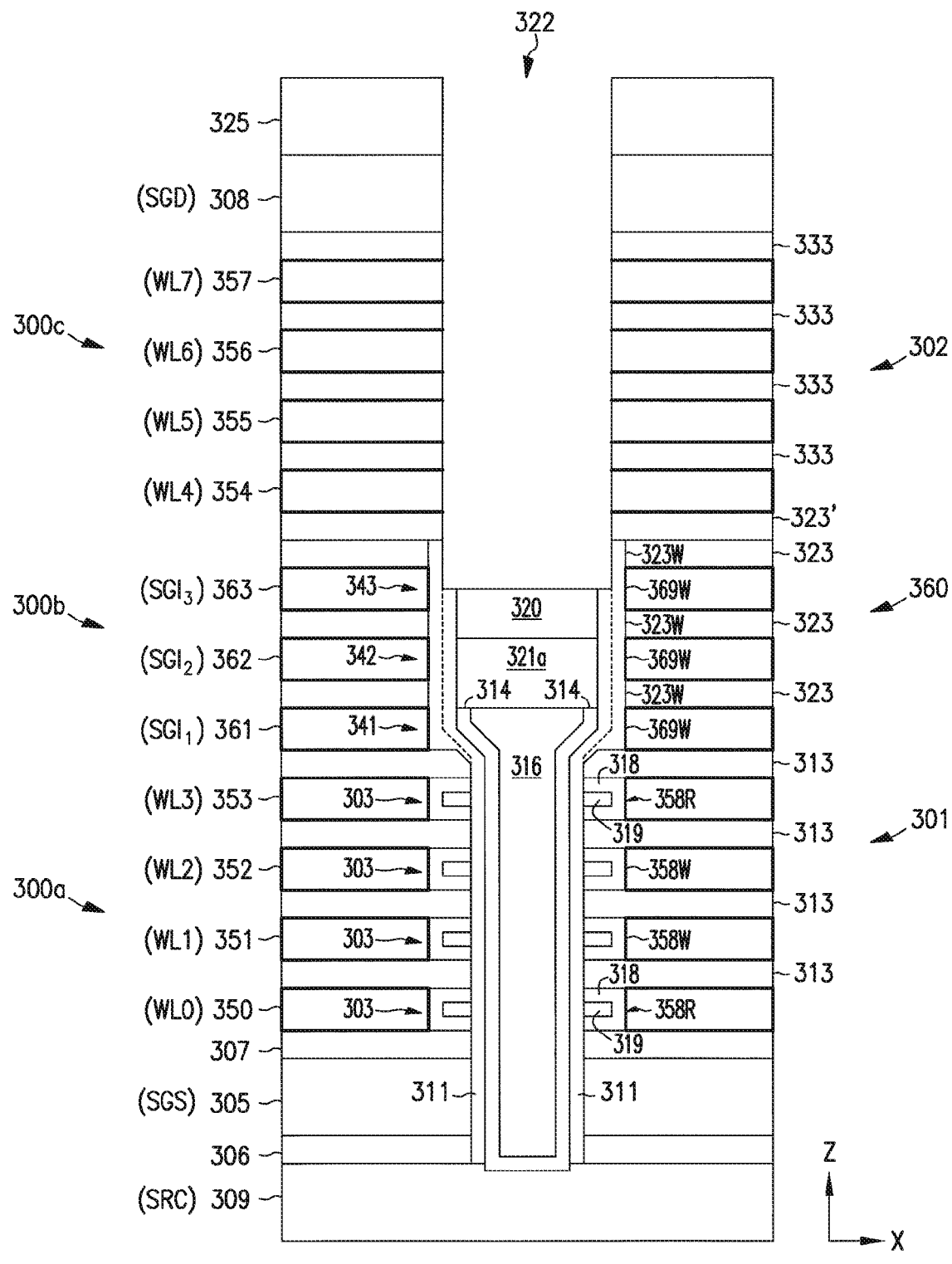
Figure 3Q:
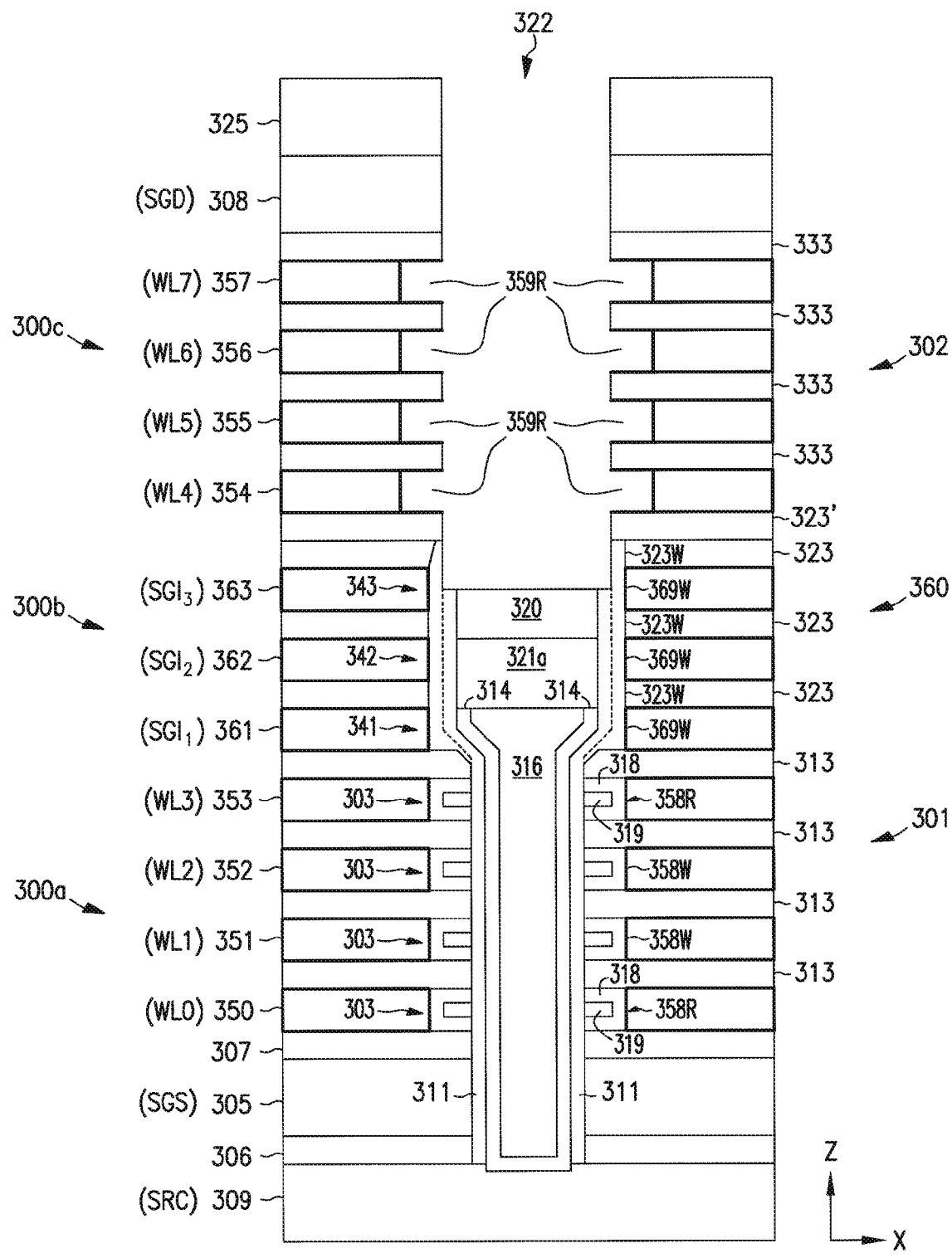
Figure 3R:
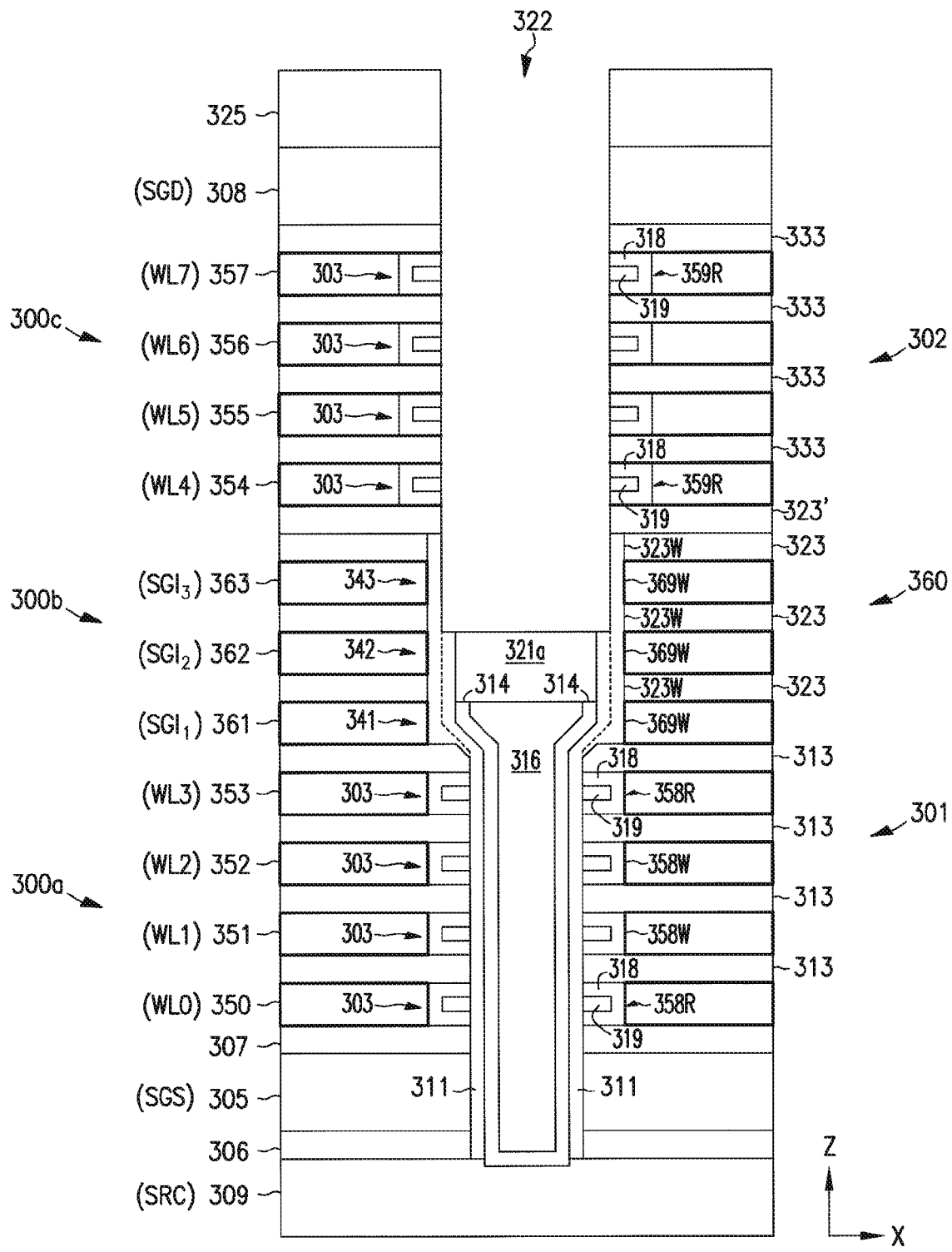
Figure 3S:
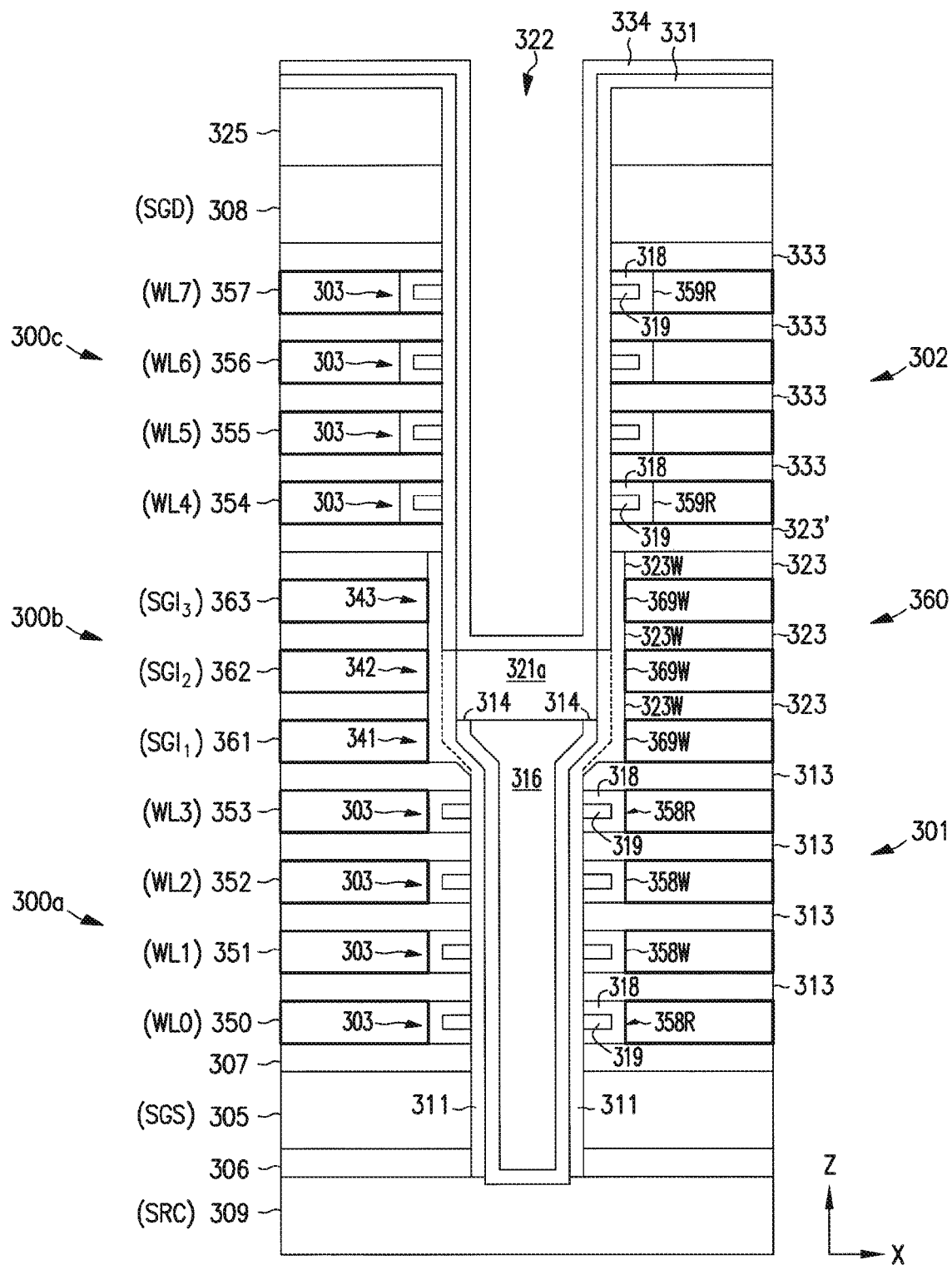
Figure 3T:
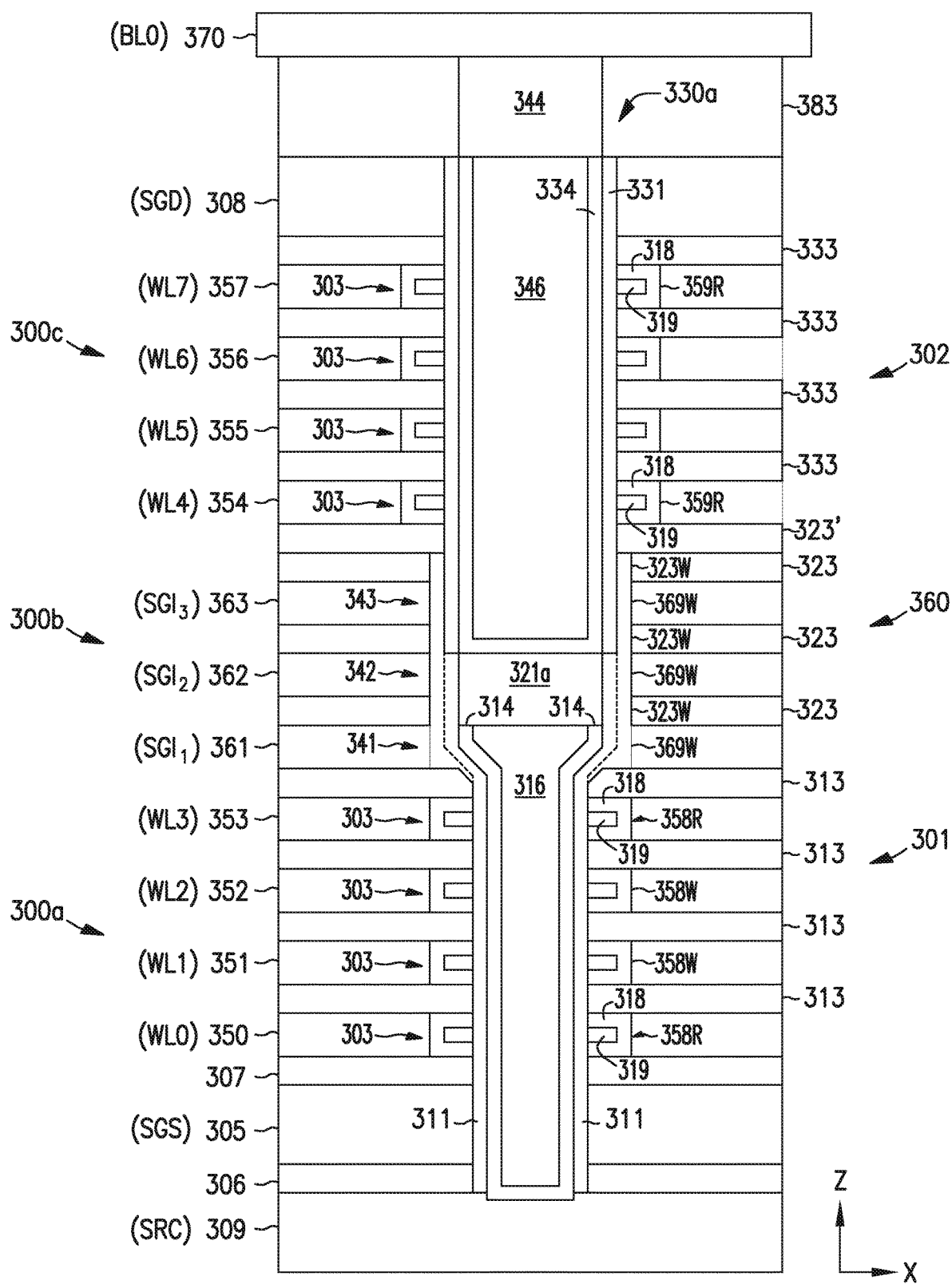

FIG. 3A through FIG. 3T show different portions of fabrication processes of forming a memory device 300, according to an embodiment of the invention. The processes described below with reference to FIG. 3A through FIG. 3T can also be used to form a memory device 100 (FIG. 1) and memory device 200 (FIG. 2A and FIG. 2B). The techniques and fabrication processes described herein can be extended to a number of different apparatuses (e.g., in addition to memory devices) to be fabricated using processes including, for example, a three-dimensional process. However, fabrication of a NAND memory device will be described below to retain clarity and consistency in the discussions that follow.

FIG. 3A shows memory device 300 during processes of forming a deck (deck of memory cells) 301 and an interface (e.g., deck interface 360) of memory device 300. As shown in FIG. 3A, deck 301 and interface 360 can be formed in portion 300a and 300b, respectively, of memory device 300. Deck 301 can include a source material 309, a dielectric material 306, a select gate material 305, and a dielectric material 307. Deck 301 can also include conductor materials 350 through 353 interleaved with dielectric materials 313, and conductor materials 361, 362, and 363 interleaved with dielectric materials 323.

Deck 301 and interface 360 can be formed by techniques known to those skilled in the art. For example, each of the materials of deck 301 and interface 360 (and other materials described herein) may be applied, deposited, or otherwise formed according to techniques and methods known independently in the art. The techniques and methods can include one or more deposition activities, such as chemical vapor deposition (CVD), atomic level deposition (ALD), physical vapor deposition (PVD), or other techniques known independently in the art. Forming multiple materials in different levels may be accomplished by stacked deposition operations.

Although the process acts and operations described herein may refer to particular conductor materials (e.g., conductively doped polysilicon, metal, and others), semiconductor materials (e.g., silicon), or dielectric materials (such as silicon, an oxide of silicon (e.g., silicon dioxide), silicon nitride, or others), a person of ordinary skill in the art and familiar with this disclosure will recognize that other conductor materials, semiconductor materials, and dielectric materials may be substituted and still be within a scope of the disclosed subject matter. Thus, the material choices and selections presented are merely provided as an aid in understanding one example of a fabrication process.

For example, different types of semiconductor materials, such as different elemental and compound semiconductors, may be used as an alternative for or in conjunction with silicon. Additionally, different types of dielectric materials, such as tantalum pentoxide ($Ta_2O_5$), silicon nitride (e.g., $Si_3N_4$), aluminum oxide ($Al_2O_3$), hafnium oxide ($HfO_2$), and a variety of other dielectric materials can be used as an alternative to or in conjunction with silicon dioxide or silicon nitride.

In FIG. 3A, source material 309 can be part of a source (e.g., a conductive region) that can correspond to source 209 of FIG. 2B. FIG. 3A shows signal SRC (which is the same signal associated with select line source 209 in FIG. 2B) to indicate that the source of memory device 300 in FIG. 3A formed from source material 309 can also conduct signals similar to, or identical to, signal SRC in FIG. 2B.

Source material 309 in FIG. 3A can include, for example, a conductively doped polysilicon (N+ (N plus) doped polysilicon) material, a silicide material (e.g., $WSi_2$), or other conductive materials, formed in or on a substrate (not shown in FIG. 3B, but such a substrate can be similar to or identical to substrate 299 of FIG. 2B). In another example, source material 309 can include a conductively doped region of a substrate (not shown in FIG. 3B, but such a substrate can be similar to or identical to substrate 299 of FIG. 2B). In some cases, source material 309 can include a combination of two different levels (e.g., two layers in the z-direction) of materials. For example, source material 309 can include one level (e.g., a layer) of a silicide material (e.g., $WSi_2$) formed on a semiconductor substrate (e.g., substrate 299 of FIG. 2B) and another level (e.g., another layer) of conductively doped polysilicon (e.g., N+ doped polysilicon) formed on the level of the silicide material.

As referred to herein, a semiconductor substrate (e.g., substrate 299 of FIG. 2B and other substrates mentioned in this description) can be any of different types of substrates used in the semiconductor and allied industries, such as silicon wafers, compound wafers, thin film head assemblies, and polyethylene-terephthalate (PET) films deposited or otherwise formed with a semiconducting material, as well as numerous other types of substrates known independently in the art, and/or portions thereof. In some structures of memory device 300, source material 309 may be formed over a non-semiconductor material.

Dielectric materials 306 and 307 of memory device 300 in FIG. 3A may include the same material or different materials. For example, dielectric materials 306 and 307 can include silicon dioxide ($SiO_2$). Further, dielectric materials 306 and 307 may be formed from the same material but by different techniques. For example, dielectric material 306 may be a thermally-grown silicon dioxide material and dielectric material 307 may be a deposited silicon dioxide material (or vice versa).

Select gate material 305 can form part of a select line similar to, or identical to, select line 205 in FIG. 2B. Select gate material 305 can include a conductor material (e.g., conductively doped polysilicon). FIG. 3A shows signal SGS (which is the same signal associated with select line 205 in FIG. 2B) to indicate that the select line of memory device 300 in FIG. 3A formed from select gate material 305 can also conduct a signal similar to, or identical to, signal SGS in FIG. 2B.

In FIG. 3A, material 315 may include silicon nitrite ($Si_3N_4$) or other material (e.g., polysilicon). As described below, material 315 may be removed before forming another deck (e.g., a top deck) over interface 360.

Dielectric materials 313 and 323 can include silicon dioxide or a number of other dielectric materials. Dielectric materials 313 and 323 can be formed (e.g., engineered) to have different properties. For example, dielectric materials 323 can be formed to be "softer" than dielectric materials 313. The softer property of dielectric materials 323 allows dielectric materials 323 to have a relatively higher etch rate (e.g., higher material removal rate) than dielectric materials 313. As described below (e.g., with reference to FIG. 3C), the softer property of dielectric materials 323 allows a removal process (e.g., a vapor etch) to selectively remove a portion of dielectric materials 323 to form recesses in dielectric materials 323 while causing minimal or no effect on (e.g., while not removing) portions of other materials (e.g., dielectric materials 313) below dielectric materials 323 during such a process.

Conductor materials 350 through 353, 361, 362, and 363 can include the same material. For example, conductor materials 350 through 353, 361, 362, and 363 can include conductively doped polysilicon (e.g., n-type polysilicon). In this example, the doping concentration (e.g., N-type dopants) of conductor materials 361, 362, and 363 can be the same as the doping concentration of conductor materials 350 through 353. For example, conductor materials 350 through 353, 361, 362, and 363 can include N− (N minus) doped polysilicon.

Conductor materials 350 through 353, 361, 362, and 363 can be formed with the same thickness (e.g., vertical dimension (or vertical thickness)) T0 in the z-direction, which is the direction perpendicular to the levels of memory device 300 where corresponding conductor materials 350 through 353, 361, 362, and 363 and dielectric materials 313 and 323 are located. Conductor materials 350 through 353, 361, 362, and 363 can also be equally spaced part, such that a distance (e.g., vertical distance) D0 in the z-direction between two adjacent conductor materials (among conductor materials 350 through 353, 361, 362, and 363) can be the same. Two adjacent conductor materials (e.g., 352 and 353, or 353 and 361) are the conductor materials located immediately next to each other. The distance between two particular adjacent conductor materials (e.g., between 352 and 353, or between 353 and 361) can be defined by the thickness in the z-direction of a respective dielectric material (313 or 323) between the two particular adjacent conductor materials. The thickness (e.g., vertical dimension (or vertical thickness)) of each of dielectric materials 313 is equal to distance D0.

Conductor materials 350 through 353 can form parts of control gates similar to, or identical to, control gates 250 through 253, respectively, in FIG. 2B. FIG. 3A shows signals WL0 through WL3 (which are the same signals associated with control gates 250 through 253 in FIG. 2B) to indicate that the control gates of deck 301 in FIG. 3A formed from conductor materials 350 through 353 can also conduct signals (e.g., word line signals) similar to, or identical to, the signals WL0 through WL3 in FIG. 2B.

FIG. 3A shows four conductor materials 350 through 353 as an example. The number of conductor materials 350 through 353 can vary, depending on the number of levels (e.g., tiers) of memory cells in deck 301. For example, deck 301 shows four levels (e.g., four tiers) of memory cells associated with four corresponding levels (e.g., four tiers) of conductor materials 350 through 353. However, if the levels of memory cells is N (e.g., an integer), then the number of conductor materials 350 through 353 can also be equal to N.

Conductor materials 361, 362, and 363 in FIG. 3A can form part of control gates similar to, or identical to, control gates 261, 262, and 263, respectively, in FIG. 2B. FIG. 3A shows signals $SGI_1$, $SGI_2$, and $SGI_3$ (which are the same signals associated with control gates 261, 262, and 263 in FIG. 2B) to indicate that the control gates of interface 360 in FIG. 3A formed from conductor materials 361, 362, and 363 can also conduct signals similar to, or identical to, the signals $SGI_1$, $SGI_2$, and $SGI_3$ in FIG. 2B. In FIG. 3A, the control gates formed from conductor materials 361, 362, and 363 can be electrically coupled to each other. Thus, the same voltage can be provided to signals $SGI_1$, $SGI_2$, and $SGI_3$ during an operation of memory device 300.

FIG. 3A shows three conductor materials 361, 362, and 363 as an example. The number of conductor materials 361, 362, and 363 can vary, depending on the number of switches (e.g., switches similar to switches 241, 242, and 243) to be formed in interface 360. For example, interface 360 shows three conductor materials 361, 362, and 363 to indicate an example where three switches (e.g., switches similar to switches 241, 242, and 243) associated with controlled by) conductor materials 361, 362, and 363 will be formed in interface 360. However, conductor materials 361, 362, and 363 can be different from three. For example, interface 360 can include four or more (at least three) conductor materials (e.g., include four conductor materials similar to conductor materials 361, 362, and 363) if four or more switches (e.g., switches similar to switches 241, 242, and 243) are to be formed in interface 360. In another example, interface 360 can include fewer than three (e.g., only one or only two) conductor materials (e.g., include only one or only two of conductor materials 361, 362, and 363) if only one switch or only two switches (e.g., switches similar to switches 241, 242, and 243) are to be formed in interface 360.

FIG. 3B shows memory device 300 after an opening (e.g., a hole) 310 is formed in the materials of deck 301. Opening 310 can be formed by removing (e.g., by etching or by drilling through) a portion each of the of material 315, dielectric materials 323 and 313, conductor materials 350 through 353, 361, 362, and 363, dielectric material 307, select gate material 305, and dielectric material 306. Thus, opening 310 can go continuously through a portion of conductor materials 350 through 353, 361, 362, and 363, and a portion of dielectric materials 313 and 323. As shown in FIG. 3B, opening 310 can include an opening portion 310' in deck 301 (e.g., in portion 300a of memory device 300) and an opening portion 310" in interface 360 (e.g., in portion 300b of memory device 300).

FIG. 3C shows memory device 300 after recesses 323R are formed in respective dielectric materials 323 at opening portion 310". Forming recesses 323R can include removing a portion of dielectric materials 313 (at the locations of recesses 323R) and leaving a remaining portion of dielectric materials 323 as shown in FIG. 3C. Each of dielectric materials 323 can have a sidewall (vertical sidewall) 323W exposed at opening portion 310". Each of recesses 323R can be adjacent sidewall 323W of a respective dielectric material among dielectric materials 323 where recesses 323R are formed. Removing a portion of each of dielectric materials 323 to form a respective recess 323R can include using a removal process (e.g., oxide vapor etch (or vapor cut) process) that is high selectivity localized to dielectric materials 323. As mentioned above, dielectric materials 323 can be formed to be relatively softer (e.g., have a higher etch rate) than dielectric materials 313. Thus, in FIG. 3C, the removal process (e.g., oxide vapor cut) can be localized on dielectric materials 323, such that only portions of dielectric materials 323 are removed while dielectric materials 313 can be relatively unchanged.

FIG. 3D shows memory device 300 after a portion of each of conductor materials 361, 362, and 363 at opening portion 310" is removed and after recesses 358R are formed in respective conductor materials 350 through 353. As shown in FIG. 3D, each of conductor materials 361, 362, and 363 can have a sidewall (vertical sidewall) 369W exposed at opening portion 310" and approximately aligned with sidewalls 323W of dielectric materials 323. Each of dielectric materials 323 can also have a sidewall (e.g., sidewall 323W) exposed at opening portion 310". Each of conductor materials 350 through 353 can have a sidewall (vertical sidewall) 358W exposed at opening portion 310'. Each of recesses 358R can be adjacent sidewall 358W of a respective conductor material among conductor materials 350 through 353 where recesses 358R are formed.

In FIG. 3D, removing a portion of each of conductor materials 361, 362, and 363 at opening portion 310" leaves a remaining portion of conductor materials 361, 362, and 363 in interface 360 as shown in FIG. 3D. Forming recesses 358R can include removing a portion of each of conductor materials 350 through 353 (at the location of respective recesses 358R) and leaving a remaining portion of conductor materials 350 through 353 in deck 301 as shown in FIG. 3D. Removing a portion of conductor materials 350 through 353 can include performing an etch process (e.g., an isotropic etch), such that portions of conductor materials 350 through 353 can be recessed (e.g., laterally removed in the x-direction to form recesses 358R). Portions of respective conductor materials 350 through 353, 361, 362, and 363 can be concurrently removed (e.g., removed using the same process at the same time).

As described below, additional dielectric material gate dielectric) can be formed on sidewalls 323W and 369W to allow each of conductor materials 361, 362, and 363 and the additional dielectric material to form part of a switch (e.g., a FET, such as MOS transistor) such as switches 241, 242, and 243 in FIG. 2A and FIG. 2B. In FIG. 3D, recesses 358R can form cell pockets where additional elements (e.g., a dielectric structure and charge-storage portions) are to be formed in recesses 323R, such that each of recesses 323R can contain a respective memory cell (e.g., memory cell 203 of FIG. 2B).

Thus, as shown in FIG. 3D, a portion of each of dielectric materials 323 and conductor materials 361, 362, and 363 are removed before memory cells (e.g., memory cells 303 in FIG. 3F) of deck 301 are formed in recesses 358R. Preparing dielectric materials 323 and conductor materials 361, 362, and 363 this way (e.g., before forming memory cells 303 (FIG. 3F)) can improve the structure of memory device 300. For example, in comparison with recesses 358R (e.g., cell pockets), each of conductor materials 361, 362, and 363 can have a relatively smaller pocket (or no pocket) at a respective sidewall 369W. A smaller pocket (or no pocket) can prevent charge-storage material (e.g., polysilicon) from forming near sidewall 369W when the memory cells (e.g., memory cells 303 in FIG. 3F) of deck 301 are formed in recesses 358R. Thus, a switch similar to one of switches 241, 242, and 243 in FIG. 2A and FIG. 2B) having a structure of a transistor (e.g., a FET, such as MOS transistor) instead of a structure of a memory cell can be selectively formed when the memory cells of deck 301 are formed.

As shown in FIG. 3D, material (e.g., silicon nitride) 315 includes a portion 315' (e.g., an overhang portion) that extends (e.g., extends laterally in the x-direction toward a center of opening 310) away from sidewalls 323W and 369W. Portion 315' will be removed in a subsequent process (e.g., a nitride pull-back process).

FIG. 3E shows memory device 300 after portion 315' (FIG. 3D) of material 315 is removed. As shown in FIG. 3E, the remaining portion of material 315 can have a sidewall 315W that can be substantially aligned with sidewall 323W and sidewall 369W in opening portion 310E (which is an enlarged opening portion of opening portion 310" of FIG. 3B, FIG. 3C, and FIG. 3D). As described below with reference to FIG. 3J, a subsequent process will form a subsequent material (e.g., polysilicon) in opening portion 310E. The subsequent material (e.g., polysilicon) is used to form a conductive structure (e.g., a plug 321a in FIG. 3K). In FIG. 3E, removing portion 315' (e.g., using a nitride pull-back process) from material 315 at opening portion 310E can prevent pinch-off of the mentioned subsequent material (e.g., polysilicon) and avoid a formation of a void (e.g., a seam) in opening portion 310E. For example, if portion 315' is not removed, a void may be formed at a location adjacent sidewall 369W of conductor materials 361 and 362 and at a location adjacent sidewall 323W between conductor materials 361 and 362. Preventing such a pinch-off (e.g., by removing portion 315') can improve (e.g., enhance the electrical property) of a conductive structure (e.g., a plug 321a in FIG. 3K) formed in a subsequent process.

Thus, the processes described above with reference to FIG. 3B through FIG. 3E include a process of enlarging opening portion 310" (FIG. 3B, FIG. 3C, and FIG. 3D) to form opening portion (enlarged opening portion) 310E in FIG. 3E before memory cells of deck 301 are formed in recesses 358R of FIG. 3E. As described above with reference FIG. 3B through FIG. 3E, the enlarging process to form opening portion 310E includes removing a portion of each of dielectric materials 323 (FIG. 3C), removing a portion of each of conductor materials 361, 362, and 363 (FIG. 3D), and removing a portion (e.g., portion 315') of material 315 (FIG. 3E).

FIG. 3F shows memory device 300 after a formation of memory cells 303 in deck 301 (in portion 300a of memory device 300), switches 341, 342, and 343 (including dielectric structure 312) in interface 360 (in portion 300b of memory device 300, dielectric structure 311, and a conductive structure (e.g., channel structure) 314. Memory cells 303 can correspond to memory cells 203 of memory device 200 of FIG. 2B. Switches 341, 342, and 343 can correspond to switches 241, 242, and 243 of memory device 200 of FIG. 2B. In FIG. 3F, memory cells 303 can be accessed by control gates that are formed from conductor materials 350 through 353, respectively. Switches 341, 342, and 343 can be controlled (e.g., turned on or turned off) by control gates that are formed from respective conductor materials 361, 362, and 363.

In FIG. 3F, some of the processes of forming memory cells 303 and conductive structure 314 can be formed by processes for forming memory cells (e.g., floating-gate memory cells or alternatively charge-trap based memory cells) known to those skilled in the art. Thus, for simplicity, some of the processes of forming memory cells are either omitted or are not described in detail in the following description.

In FIG. 3F, forming memory cells 303 can include forming a dielectric structure 318 on sidewalls of a respective recesses 358R, and forming a charge-storage portion 319 in a respective recess 358R adjacent (e.g., partially surrounded by) dielectric structure 318.

Dielectric structure 318 can include a charge blocking material. For example, dielectric structure 318 can include silicon nitride (e.g., only silicon nitride), a combination of oxide-nitride-oxide (ONO) that includes a silicon nitride material sandwiched between silicon dioxide materials, or other charge blocking materials. Charge-storage portion 319 in a respective memory cell 303 can be configured to store information in that respective memory cell 303. Charge-storage portion 319 can include one or more of the semiconductor materials. For example, charge-storage portion 319 can be polysilicon (e.g., piece of polysilicon). In another example, charge-storage portion 319 can be silicon nitride (e.g., piece of silicon nitride $Si_3N_4$). Dielectric structure (e.g., tunneling dielectric) 311 may be formed from a number of dielectric materials that allow for Fowler-Nordheim tunneling of electrons or direct tunneling of holes or other injection mechanisms. For example, dielectric structure 311 can include deposited and/or thermally-grown silicon dioxide.

Conductive structure 314 can form part of a channel (e.g., conductive path) in deck 301 and interface 360 to conduct current (e.g., electrons or holes). Conductive structure 314 can include conductively doped polysilicon material (e.g., N− (N minus) doped polysilicon or N+ (N plus) doped polysilicon). Alternatively, conductive structure 314 can include undoped polysilicon material. Thus, conductive structure 314 can be a polysilicon structure (e.g., doped polysilicon structure (N− doped polysilicon structure or N+ doped polysilicon structure) or undoped polysilicon structure). Conductive structure 314 can be formed adjacent (e.g., formed to be conformal to a sidewall (not labeled) of dielectric structure 311. Conductive structure 314 can be formed after dielectric structure 311 and dielectric structure 312 are formed. As shown in FIG. 3F, conductive structure 314 can have a hollow structure (e.g., not a solid structure) in that the core (e.g., middle portion) of conductive structure 314 is empty (void of the material that forms conductive structure 314). Thus, conductive structure 314 can at least be part of a hollow channel (e.g. not a solid channel). In a subsequent process, a material (or materials) can be formed (e.g., deposited in or filled in) in the hollow portion (e.g., the core) of conductive structure 314.

In FIG. 3F, forming switches 341, 342, and 343 can include forming a dielectric structure 312 adjacent (e.g., formed on) sidewalls 315W, 323W, and 369W. Dielectric structure 312 can includes dielectric portions 312a and 312b. FIG. 3F shows dielectric structure 312 including two dielectric portions 312a and 312b as an example. However, dielectric structure 312 can be a single piece of dielectric material (e.g., a single piece of silicon dioxide) instead of two pieces (e.g., dielectric portions 312a and 312b) of different dielectric materials.

As shown In FIG. 3F, each of memory cells 303 can include a respective charge-storage portion 319. However, unlike each of memory cells 303, each of switches 341, 342, and 343 may not include a respective charge-storage portion (meaning that each of switches 341, 342, and 343 may include no charge-storage portion). Thus, the entire location between dielectric structure 312 and sidewall 323W of each of conductor materials 361, 362, and 363 (which form part of control gates to control respective switches 341, 342, and 343) may include no charge-storage portion. As an example, if charge-storage portion 319 in each of memory cells 303 is polysilicon, then switches 341, 342, and 343 may include no polysilicon at the entire location between dielectric structure 312 (e.g., between dielectric portion 312a) and sidewall 323W of each of conductor materials 361, 362, and 363. In another example, if charge-storage portion 319 in each of memory cells 303 is silicon nitride, then switches 341, 342, and 343 may include no silicon nitride at the entire location between dielectric structure 312 (e.g., between dielectric portion 312a) and sidewall 323W of each of conductor materials 361, 362, and 363.

Some portions or all of the portions of dielectric structure 312 can be formed after some portions of memory cells 303 are formed. For example, dielectric portion 312a, dielectric portion 312b, or both can be formed after charge-storage portion 319 is formed.

Some portions or all of the portions of dielectric structure 312 can be formed before some portions of memory cells 303 are formed. For example, dielectric portion 312a can be formed before charge-storage portion 319 is formed.

Some portions or all of the portions of dielectric structure 312 can be formed at the same time (e.g., formed by the same process step) as some of portions of memory cells 303. For example, part of dielectric portion 312a or the entire dielectric portion 312a can be formed when (e.g., formed at the same time) dielectric structure 318 of memory cells 303 is formed. In another example, part of dielectric portion 312b or the entire dielectric portion 312b can be formed when (e.g., formed at the same time) dielectric structure 311 is formed. Thus, in this example, dielectric structure 311 and dielectric portion 312b can be included in the same dielectric material (e.g., the same piece of silicon dioxide). In a further example, dielectric portions 312a and 312b (e.g., where dielectric structure 312 is a single piece of dielectric material) can be formed when (e.g., formed at the same time) dielectric structure 311 is formed.

Dielectric portions 312a and 312b can have the same dielectric material. For example, dielectric structure 312 can include the same material (e.g., silicon dioxide) occupying the entire location (e.g., continuously extending) from conductive structure 314 to sidewalk 315W, 323W, and 369W. In this example, dielectric structure 312 can be a single piece of dielectric material (e.g., single piece of silicon dioxide) occupying the entire location (e.g., continuously extending) from conductive structure 314 to sidewalls 315W, 323W, and 369W.

In an alternative structure of memory device 300, dielectric structure 312 can have different dielectric materials such that dielectric portions 312a and 312b can have the different dielectric materials. For example, in an alternative structure of memory device 300, dielectric portion 312a can include an oxide-nitride-oxide (ONO) material, and dielectric portion 312b can include silicon dioxide (e.g., can include only silicon dioxide). In this example, dielectric portion 312a can have the same material (or a combination of materials (e.g., ONO materials)) as dielectric structure 318 of memory cells 303, and dielectric portion 312b can have the same material (e.g., silicon dioxide) as dielectric structure 311.

As mentioned above, switches 341, 342, and 343 (FIG. 3F) can correspond to switches 241, 242, and 243 (FIG. 2A and FIG. 2B), respectively. For example, each of switches 341, 342, and 343 can operate as a transistor (e.g., MOS transistors). In FIG. 3F, a portion (e.g., a vertical portion in the z-direction) of dielectric structure 312 can be a gate dielectric (e.g., gate oxide) of the transistor included in a respective switch among switches 341, 342, and 343.

FIG. 3G shows memory device 300 after a material (e.g., filling dielectric) 316 is formed. Forming material 316 can include depositing dielectric material (e.g., silicon dioxide) in opening 310 and filling the core of (and being surrounded by) conductive structure 314. Then, a flattening process (e.g., chemical mechanical polishing (CMP)) can be performed to flatten (e.g., planarize) the surface of material 316.

FIG. 3H shows memory device 300 after a portion of conductive structure 316 is removed from opening portion 310H of opening 310. Removing the portion of material 316 from opening portion 310H can include using an etch process.

FIG. 3I shows memory device 300 after a portion of material 314 is removed from opening portion 310H and a remaining portion of conductive structure 314 is left in opening 310. As shown in FIG. 3I, conductive structure 314 can have a length extending perpendicular (e.g., vertically) to the levels in portion 300a of memory device 300 where respective conductor materials 350 through 353 are located.

FIG. 3J shows memory device 300 after a material 321 is formed at opening portion 310H (FIG. 3H) where a portion of material 316 was removed. Forming material 321 can include depositing a material at opening portion 310H (FIG. 3H) such that material 321 fills the opening portion 310H and contacts (e.g., is directly coupled to) conductive structure 314. Then, a flattening process (e.g., CMP) can be performed to flatten (e.g., planarize) the surface of material 321. Material 321 can include undoped or doped polysilicon. For example, material 321 can include conductively doped polysilicon (either N− or N+ doped polysilicon). As described above with reference to FIG. 3F, conductive structure 314 can include conductively doped polysilicon (N− or N+ doped polysilicon). Thus, in FIG. 3J, material 321 and conductive structure 314 can have the same doping concentration (e.g., N− doped polysilicon). In an alternative structure of memory device 300, material 321 and conductive structure 314 can have different doping concentrations. For example, conductive structure 314 can be N− doped polysilicon and material 321 can be either undoped polysilicon or N+ doped polysilicon (which has a higher doping concentration than N− doped polysilicon). In a further example, both conductive structure 314 and material 321 can be undoped polysilicon.

FIG. 3K shows memory device 300 after a plug (e.g., a polysilicon plug) 321a is formed in opening portion 310K of opening 310. Plug 321a is solid plug (e.g., a piece of polysilicon) that fills part (e.g., part of a bottom half) of opening portion 310K. Plug 321a is separated from sidewalls 369W of conductor materials 361, 362, and 363 by dielectric structure 312. Forming plug 321a can include removing a portion of material 321 at opening portion 310K and leaving a remaining portion of material 321, which is plug 321a, in the opening portion 310K as shown in FIG. 3K. Removing the portion of material 321 can include using an etch process (e.g., dry etch process) selective to material 312. As shown in FIG. 3K, opening portion 310K includes an opening in each of conductor materials 361, 362, and 363 that is void of the material (e.g., conductively doped polysilicon) of conductor materials 361, 362, and 363. Thus, in FIG. 3K, plug 321a is formed in an opening (e.g., which is part of opening portion 310K) of conductor materials 361, 362, and 363.

FIG. 3L shows memory device 300 after a removal of material 315 and a portion (e.g., top portion) of dielectric structure 312. Removing material 315 and a portion of dielectric structure 312 can include using an etch process (e.g., wet etch process). Removing material 315 (e.g., silicon nitride) is performed because conductive material (e.g., channel) is preferred to be either controlled by a transistor at the same level or near a heavily doped polysilicon.

FIG. 3M shows memory device 300 after a material (e.g., a sacrificial stopper) 320 is formed over (e.g., directly on) plug 321a. Forming material 320 can include depositing conductive material (e.g., metal-base material) over plug 321a and stopping at the level (e.g., surface) of dielectric material 323 located directly on conductor material 363. Material 320 can include metal (e.g., tungsten), metal oxide (e.g., aluminum oxide), or other materials.

Material 320 is formed to protect other elements (e.g., elements below material 320) during subsequent processes of forming an additional (e.g. an upper) deck (e.g., deck 302 in FIG. 3O) of memory device 300. Material 320 (which is a sacrificial material) also serves as a stopper for an opening (e.g., opening 322 in FIG. 3P) that is formed during the processes of forming an upper deck of memory device 300. Material 320 is removed from memory device 300 during the processes of forming the additional deck of memory device 300. Thus, material 320 is non-existent in memory device 300 after memory device 300 is formed.

As described above with reference to FIG. 3J, material 321 (which is used to form plug 321a in FIG. 3M) can be conductively doped polysilicon (e.g., N− or N+ doped polysilicon). Thus, plug 321a in FIG. 3M can also be conductively doped polysilicon (e.g., N− or N+ doped polysilicon). As described above with reference to FIG. 3J, material 321 can alternatively be undoped polysilicon. Thus, plug 321a in FIG. 3M can alternatively be undoped polysilicon. Thus, plug 321a in FIG. 3M can be a polysilicon structure (e.g., doped polysilicon structure (N− doped polysilicon structure or N+ doped polysilicon structure) or undoped polysilicon structure).

As shown in FIG. 3M, dielectric structure 311 has at thickness T1 in the x-direction from charge-storage portion 319 to conductive structure 314. Dielectric structure 312 has at thickness T2 in the x-direction from sidewall 369W to plug 321a. Thickness T2 is greater than thickness T1 (T2>T1). In comparison with some conventional memory devices, making thickness T2 greater than thickness T1 can allow switches 341, 342, and 343 to have a relatively high breakdown voltage, which allows switches 341, 342, and 343 to handle a range of voltages (e.g., including relatively high voltages) used during different operations of a memory device, such as memory device 300. Moreover, processes of forming interface 360 switches 341, 342, and 343 can be compatible with processes of forming other elements (e.g., memory cells 303) of memory device 300, making the incorporation of interface 360 in memory device 300 feasible. Further, the inclusion of interface 360 allows a better control of the space region associated with switches 341, 342, and 343.

As shown in FIG. 3M, plug 321a has a thickness T3 in the z-direction perpendicular to the levels of memory device 300 (e.g., the direction perpendicular to the levels of memory device 300 where corresponding conductor materials 361, 362, and 363 are located). Thickness T3 can be greater than the thickness (in the z-direction) of each of conductor materials 361, 362, and 363. In an alternative structure of memory device 300, thickness T3 can be different (e.g., less than or greater than) the thickness of T3 shown in FIG. 3M. Thus, thickness T3 can be equal to or less than the thickness of each of conductor materials 361, 362, and 363.

FIG. 3N shows memory device 300 after dielectric material 323' is formed over (e.g., directly on) dielectric material 323 above conductor material 363. Dielectric material 323' can also be formed over (e.g., directly on) material 320. Forming dielectric material 323' can include depositing dielectric material over dielectric material 323 and material 320. Dielectric material 323' can be the same (e.g., silicon dioxide) as dielectric material 323.

FIG. 3O shows a beginning of a formation of deck (e.g., deck of memory cells) 302 in portion 300c of memory device 300. Forming deck 302 can include forming conductor materials 354 through 357 interleaved with dielectric materials 333. Forming deck 302 can include forming select gate material 308 and material 325. Material 325 can include the same material (e.g., silicon nitride or polysilicon) as dielectric material 315. Select gate material 308 can have the same material (e.g., conductively doped polysilicon) as select gate material 305. Select gate material 308 can be part of a select line similar to, or identical to, select line 210 (or 211) in FIG. 2B. FIG. 3O shows signals SGD (which is signal SDG0 (or signal SGD1) associated with select line 210 (or 211) in FIG. 2B) to indicate that the select line of memory device 300 in FIG. 3A formed from select gate material 308 can also conduct a signal similar to, or identical to, signal SDG0 or signal SGD1 in FIG. 2B.

In FIG. 3O, conductor materials 354 through 357 can include the same materials (e.g., conductively doped polysilicon) as conductor materials 350 through 353, 361, 362, and 363. Conductor materials 354 through 357 can also have the same thickness (in the z-direction) as conductor materials 350 through 353, 361, 362, and 363. Dielectric materials 333 can include the same material (e.g., silicon dioxide) as dielectric materials 313. Thus, dielectric materials 323 can also have an etch rate different (e.g., higher than) the etch rate of dielectric materials 333.

Conductor materials 354 through 357 can form of parts of control gates similar to, or identical to, control gates 254 through 257, respectively, in FIG. 2B. FIG. 3O shows WL4 through WL7 (which are the same signals associated with control gates 254 through 257 in FIG. 2B) to indicate that the control gates of deck 302 in FIG. 3O formed from conductor materials 354 through 357 can also conduct signals (e.g., word line signals) similar to, or identical to, the signals WL4 through WL7 in FIG. 2B.

FIG. 3O shows four conductor materials 354 through 357 as an example. The number of conductor materials 354 through 357 can vary, depending on the number of levels (e.g., tiers) of memory cells in deck 302. For example, deck 302 shows four levels (e.g., four tiers) of memory cells associated with four corresponding levels (e.g., four tiers) of conductor materials 354 through 357. However, if the levels of memory cells is M (e.g., an integer), then the number of conductor materials 350 through 353 can also be equal to M. Decks 301 and 302 can have the same or different number of levels (e.g., tiers) of memory cells.

Deck 302 can be formed by techniques known to those skilled in the art. For example, each of the materials of deck 302 (and other materials described herein) may be applied, deposited, or otherwise formed according to techniques and methods known independently in the art. The techniques and methods can include one or more deposition activities, such as CVD, ALD, PVD, or other techniques known independently in the art. Forming multiple materials in different levels may be accomplished by stacked deposition operations. For simplicity, detailed processes forming memory cells in deck 302 are not described in detail.

FIG. 3P shows memory device 300 after an opening (e.g., hole) 322 is formed in the materials of deck 302. Opening 322 can be formed by removing (e.g., by etching) a portion each of material 325, dielectric materials 333, and conductor materials 354 through 357. Forming opening 322 may include removing a portion of dielectric structure 312 (FIG. 3M) and a portion of material 320.

FIG. 3Q shows memory device 300 after recesses 359R are formed in respective conductor materials 354 through 357 in deck 302. Forming recesses 359R of deck 302 can be similar to forming recesses 358R of deck 301. In subsequent processes, memory cells of deck 302 will be formed in recesses 358R. Memory cells of deck 302 are formed to be the same as memory cells 303 of deck 301. Thus, recesses 359R may be formed to be aligned (e.g., vertically aligned) with recesses 358R in the z-direction, such that memory cells of deck 302 can be aligned (e.g., vertically aligned) with memory cells 303 of deck 301. FIG. 3Q shows an example where recesses 359R may be vertically offset from recesses 358R, meaning that recesses 359R may not be aligned (e.g., may not be vertically aligned) with recesses 358R in the z-direction.

FIG. 3R shows memory device 300 after memory cells 303 of deck 302 are formed in respective recesses 359R, As mentioned above, memory cells of deck 302 can be formed to be aligned (e.g., vertically aligned) with memory cells 303 of deck 301. FIG. 3R show an example where recesses 359R of deck 302 may be vertically offset from recesses 358R of deck 301. Thus, FIG. 3R shows an example where memory cells 303 of deck 302 may also be vertically offset from (e.g., not vertically aligned with) memory cells 303 of deck 301. Memory cells 303 of deck 302 can have the same structure of memory 303 of deck 301. For example, each of memory cells 303 of deck 302 can include a dielectric structure 318 and charge-storage portion 319 formed in respective recesses 359R. As shown in FIG. 3R, charge-storage portions 319 of memory cells 303 of deck 302 may be vertically aligned with each other. However, since recesses 359R of deck 302 may be vertically offset from (e.g., not vertically aligned with) recesses 358R of deck 301, charge-storage portions 319 of memory cells 303 of deck 302 may be vertically offset from (e.g., not vertically aligned with) charge-storage portions 319 of memory cells 303 of deck 301.

FIG. 3S shows memory device 300 after dielectric structure 331 and a conductive structure (e.g., channel structure) 334 are formed. Dielectric structure 331 can have the same material (e.g., silicon dioxide) as dielectric structure 311 of deck 301. Conductive structure 334 can have the same material as conductive structure 314 of deck 301. For example, conductive structure 334 can be a polysilicon structure (e.g., doped polysilicon structure (N− doped polysilicon structure or N+ doped polysilicon structure) or undoped polysilicon structure). Conductive structure 334 can have a hollow structure (e.g., not a solid structure) similar to the hollow structure of conductive structure 314. Thus, conductive structure 334 can at least be part of a hollow channel (e.g. not a solid channel). As shown in FIG. 3S, conductive structure 334 can contact plug 321a.

FIG. 3T shows memory device 300 after a formation of dielectric material (e.g., silicon dioxide) 346, a conductive contact 344, a material 383 (which can be a remaining part of material 325 (e.g., silicon nitride)), and a conductive region 370. Part of memory device 300 can be similar to, or identical to, part of memory device 200 shown in FIG. 2B. For example, FIG. 3T shows a pillar 330a, which can be similar to, or identical to, to pillar 230a of FIG. 2B. In another example, conductive region 370 can be part of a data line of memory device 300 that can be similar to, or identical to, data line 270 of FIG. 2B. In FIG. 3T, dielectric material 346, material 383, conductive contact 344, and conductive region 370 can be formed by processes known to those skilled in the art. FIG. 3T shows an example structure of dielectric material 346, material 383, conductive contact 344, and conductive region 370. However, dielectric material 346, material 383, conductive contact 344, and conductive region 370 can have a different structure as long as a conductive path (e.g., to conduct current) can be formed between conductive region 370 (e.g., part of a data line) and source material 309 during an operation of memory device 300. Such a conductive path can include conductive region 370, conductive contact 344, conductive structure 334, plug 321a, conductive structure 314, and part of (e.g., a conductive region in) source material 309.

For simplicity, FIG. 3T shows only a portion of memory device 300. However, a complete memory device 300 can include additional elements similar to or identical to those of memory device 100 (schematically shown in FIG. 1) or memory device 200 (shown in FIG. 2A and FIG. 2B). Such additional elements are omitted from this description so as to not obscure the embodiments described herein.

Improvements and benefits of interface 360, including switches 341, 342, and 343 and plug 321a, over some conventional solutions for memory device having multiple decks include the following.

Switches 341, 342, and 343 can operate to improve functionality of memory device 300 in that switches 341, 342, and 343 can be selectively controlled by their own drivers (which are different from drivers for memory cell control gates associated with signals WL0 through WL7). For example, during an operation (e.g., read or write operation) of memory device 300, switches 341, 342, and 343 can be turned on to form a conductive path (e.g., string current path through interface 360) to allow conduction of electrons through interface 360. In another operation (e.g., erase operation) of memory device 300, switches 341, 342, and 343 can be turned off when conductivity (e.g., string current) through interface 360 is unneeded. Thus, the structures and operations of switches 341, 342, and 343 can be controlled to allow conduction for electrons (e.g., during a read operation) and conduction of holes in another operation (e.g., erase operation) of memory device 300.

As shown in FIG. 3T and as described above, conductor materials 350 through 353, 361, 362, and 362 can have the same material (e.g., n-type polysilicon). By engineering the dielectric intervened between tiers, which is not part of the interface switches (e.g., transistors), such as making softer oxide, the processes of formation of interface 360 can avoid tier to tier engineering (in term of conductivity type and doping for conductor materials 350 through 353, 361, 362, and 362), thereby reducing complexity (or simplifying) the processes of forming memory device 300.

Plug 321a (which is located in interface 360 between decks 301 and 302) can protect elements (e.g., memory cells 303) of deck 301 from some of the processes of forming deck 302 after deck 301 is formed. Placing a plug (e.g., plug 321a) between decks (two decks 301 and 302 are shown in FIG. 3T as an example) of memory device 300 can also allow each deck (e.g., an upper deck) to be formed (e.g., formed independently) with minimal or no impact to a lower deck (or lower decks).

As described above, plug 321a can be doped (e.g., N− or N+) polysilicon or undoped polysilicon. This allows flexibility to form plug 321a (e.g., plug 321a can be formed with any doping concentration and any thickness) that can meet different specifications based on functionality of different memory devices. In contrast, some conventional devices may have an inter-deck structure (e.g., plug) that needs to be relatively thick and heavily doped to meet the channel out-diffusion specification in such some conventional devices. Further, plug 321a can improve (or alternatively make possible) the formation a hollow channel (e.g., channel structure 314) in a memory device such as memory device 300, whereas such a hollow channel may be difficult to form using some conventional techniques.

Figure 4:
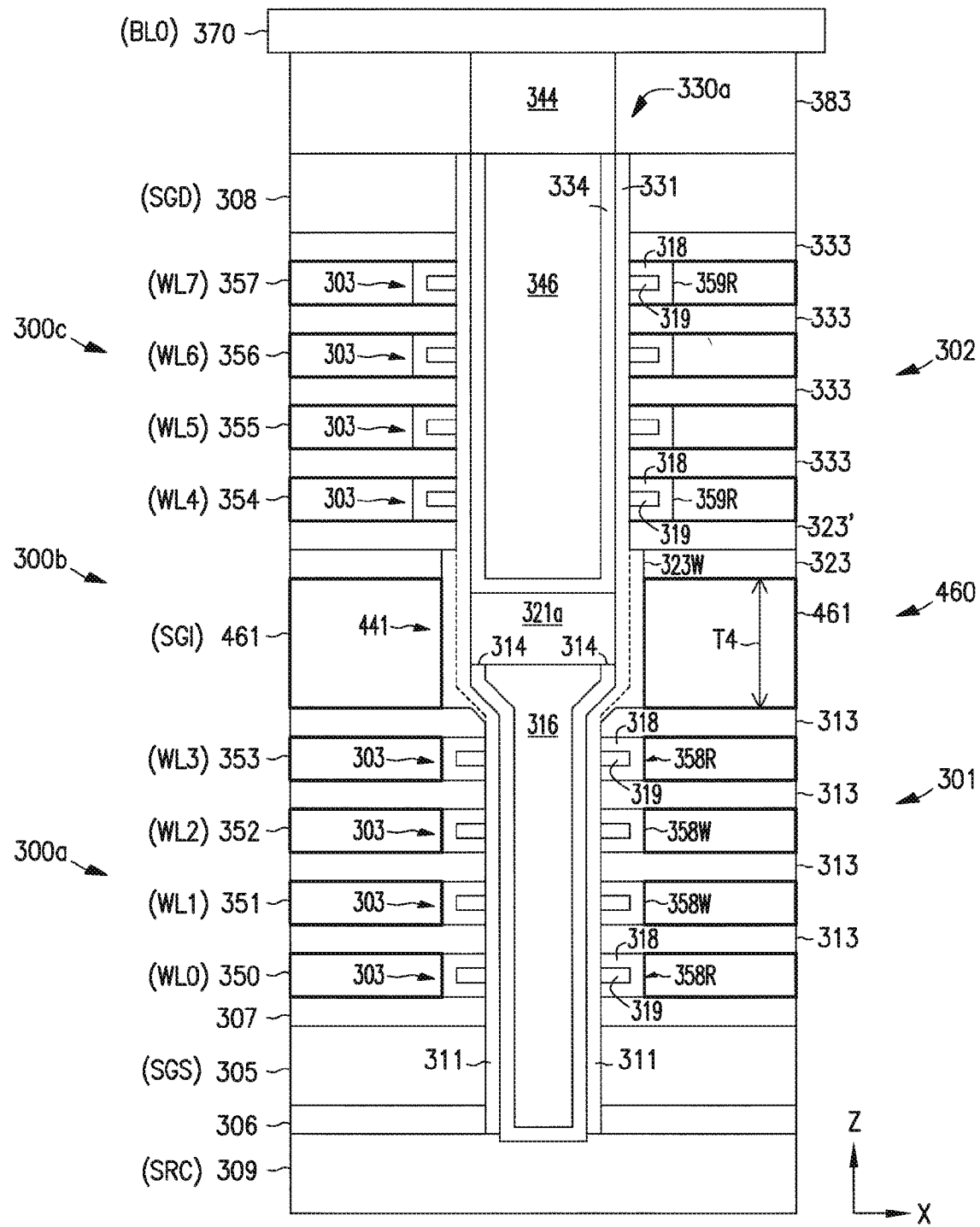
FIG. 4 shows a representation of a side view of a portion of a structure of a memory device including an interface having a single control gate, according to some embodiments of the invention.

FIG. 4 shows a representation of a side view of a portion of a structure of a memory device 400 including an interface 460 having a single control gate, according to some embodiments of the invention. Memory device 400 can be a variation of memory device 300 in FIG. 3T. For simplicity, the same reference labels are given similar or identical elements between memory device 300 of FIG. 3T and memory device 400 of FIG. 4.

As shown in FIG. 4, memory device 400 can include conductor material 461 and a switch (e.g., MOS transistor) 441 in interface 460. Switches 441 can be controlled (e.g., turned on or turned off) by a control gate (e.g., single control gate) that is formed from conductor material 461. FIG. 4 shows a signal SGI (which can be similar to one of signals $SGI_1$, $SGI_2$, and $SGI_3$ in FIG. 3T) to indicate that the control gate of interface 460 formed from conductor material 461 can also conduct signal SGI to control switch 441.

Conductor material 461 can include the same material (e.g., conductive doped polysilicon) as each of conductor materials 350 through 357. Conductor material 461 has a thickness T4 in the z-direction. Thickness T4 can be equal to or greater than the thickness of each of conductor materials 350 through 357. For example, thickness T4 can be a combined thicknesses of at least two (two or more of) conductor materials 350 through 357. In comparison with some conventional memory devices, memory device 400 can include similar improvements and benefits as memory devices 200 and 300 described above with reference to FIG. 2A through FIG. 3T.

Figure 5:
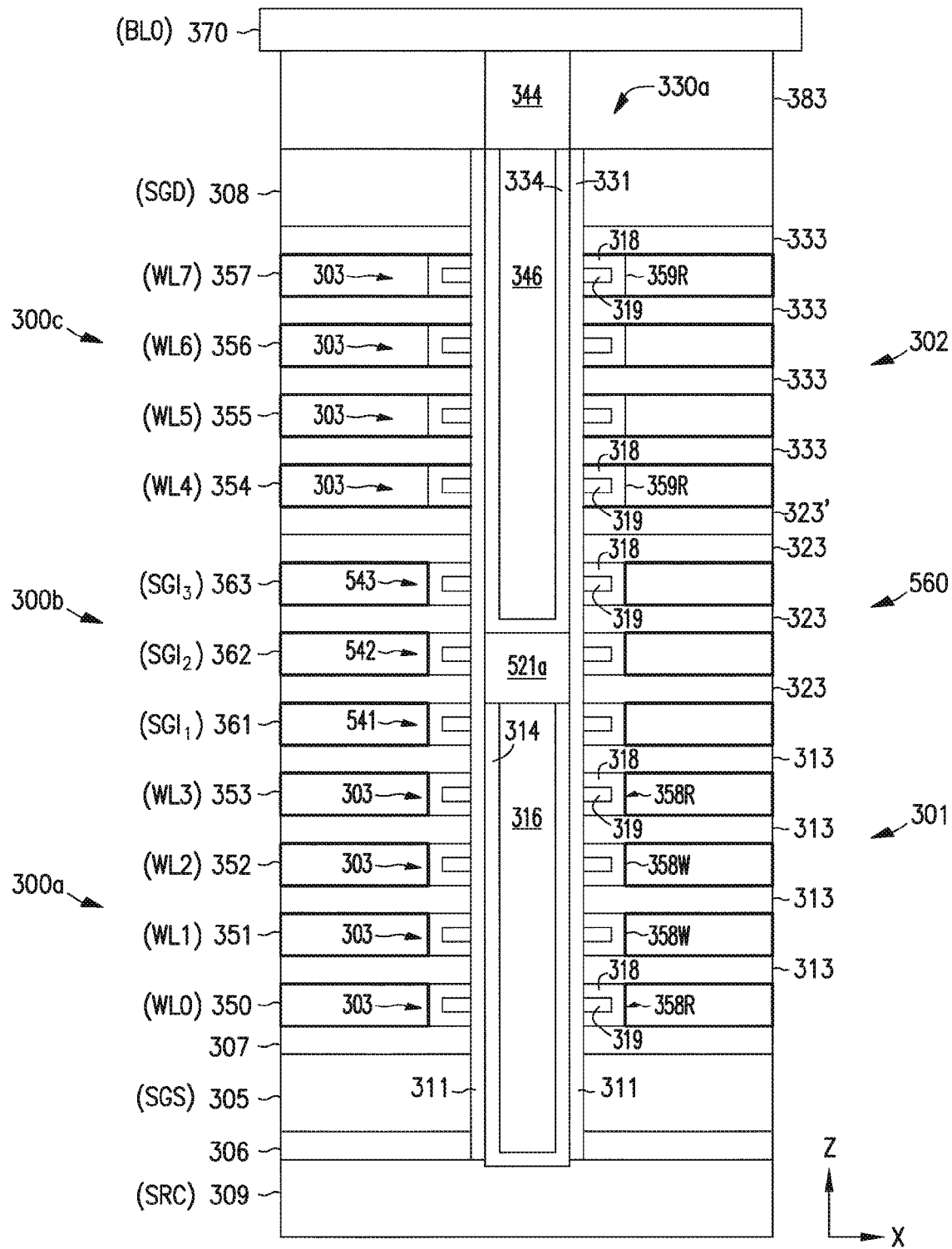
FIG. 5 shows a representation of a side view of a portion of a structure of a memory device including an interface having switches, which can have the same structures as memory cells of memory device, according to some embodiments of the invention.

FIG. 5 shows a representation of a side view of a portion of a structure of a memory device 500 including an interface 560 having switches 541, 542, and 543 that can have the same structures as memory cells 303 of memory device 500, according to some embodiments of the invention. Memory device 500 can be a variation of memory device 300 in FIG. 3T. Thus, for simplicity, the same reference labels are given similar or identical elements between memory device 300 of FIG. 3T and memory device 500 of FIG. 5.

As shown in FIG. 5, switches 541, 542, and 543 can have dielectric structure 318 a charge-storage portion 319 (e.g., polysilicon) that similar to or identical to memory cells 303. As described above, charge-storage portion 319 in each of memory cells 303 can be configured to store information. However, in FIG. 5, charge-storage portion 319 in each of switches 541, 542, and 543 is not configured to store information. Each of switches 541, 542, and 543 can be configured to operate as a transistor (e.g., MOS transistor) similar to, or identical to, each of switches 341, 342, and 343 of FIG. 3T. In FIG. 5, conductor materials 361, 362, and 363 can form part of control gates (which can conduct respective signals $SCI_1$, $SGI_2$, and $SGI_3$) to control (e.g., turn on or off) respective switches 541, 542, and 543. Memory device 500 can also include a plug (e.g., polysilicon plug) 521a, which can be similar to, or identical to, plug 321a of memory device 300 (FIG. 3T) or memory device 400 (FIG. 4). For example, plug 521a can be a structure (e.g., doped polysilicon structure (N– doped polysilicon structure or N+ doped polysilicon structure) or undoped polysilicon structure).

In comparison with some conventional memory devices, memory device 400 can include similar improvements and benefits as memory devices 200 and 300 described above with reference to FIG. 2A through FIG. 3T.

Figure 6:
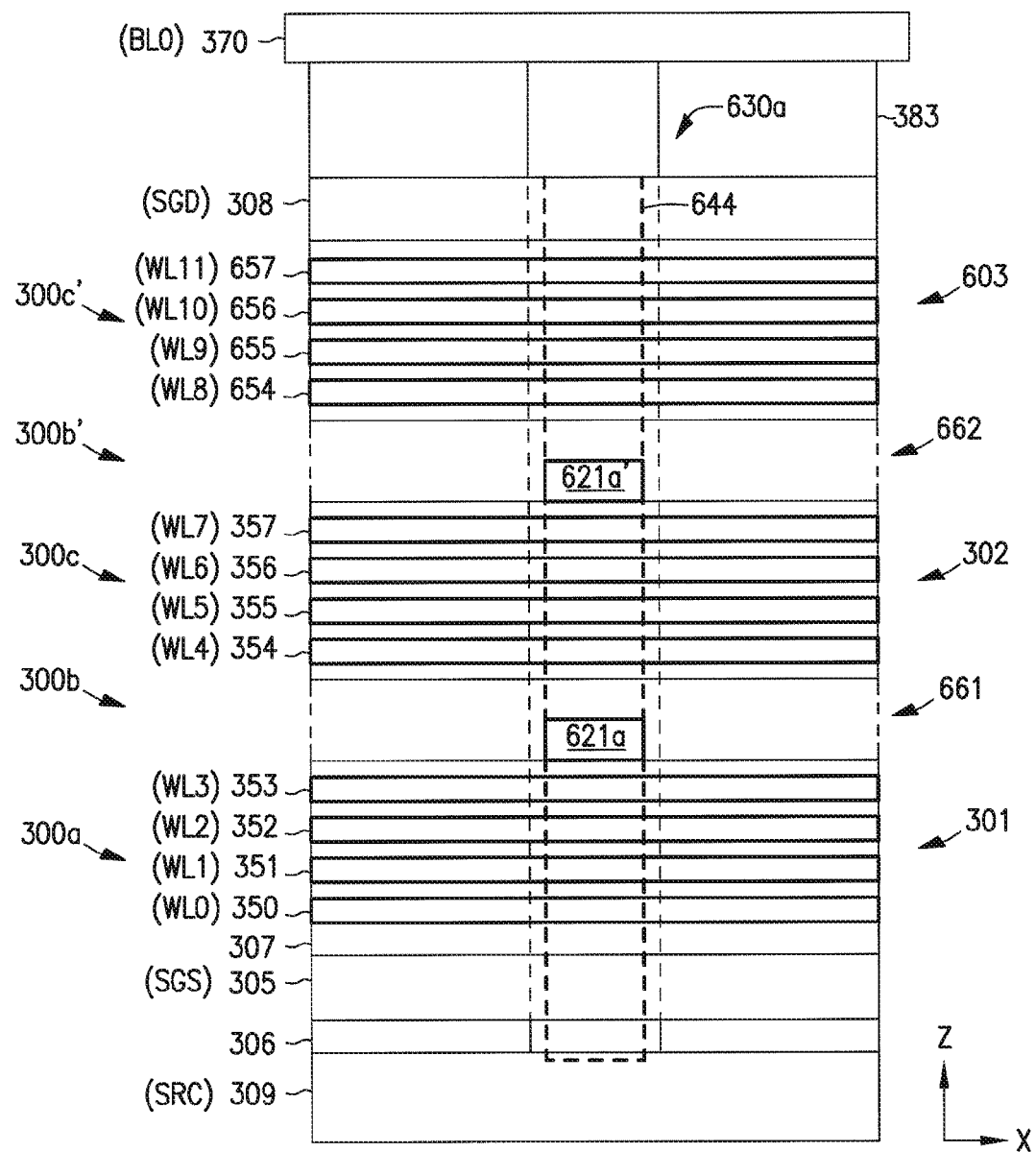
FIG. 6 shows a representation of a side view of a portion of a structure of a memory device including more than two decks of memory cells, according to some embodiments of the invention

FIG. 6 shows a representation of a side view of a portion of a structure of a memory device 600 including more than two decks of memory cells, according to some embodiments of the invention. Memory device 600 can include part of any of the memory devices described above with reference to FIG. 1 through FIG. 5. For example, memory device 600 can include part of (or alternatively different combinations of) memory device 300 (FIG. 3T), memory device 400 (FIG. 4), and memory device 500 (FIG. 5). Thus, for simplicity, the same reference labels are given similar or identical elements between memory device 600 and memory device 300 (FIG. 3T), memory device 400 (FIG. 4), and memory device 500 (FIG. 5).

As shown in FIG. 6, memory device 600 can include decks (e.g., decks of memory cells) 301, 302, and 603, and interfaces 661 and 662. Decks 301, 302, and 603 can be formed in respective portions 300a, 300c, and 300c' of memory device 600. For simplicity, FIG. 6 omits detailed structures (e.g., memory cells) of decks 301, 302, and 603. However, decks 301, 302, and 603 can include memory cells and other elements similar to or identical to memory cells 303 and other elements of memory devices 300, 400, and 500. In FIG. 6, deck 603 can include conductor materials 654, 655, 656, and 657 that can form part of control gates (which can conduct signals WL8 through WL11) to access the memory cells in deck 603.

Interfaces 661 and 662 can be formed in respective portions 300b and 300b' memory device 600. For simplicity, FIG. 6 omits detailed structures (e.g., conductor materials, switches, polysilicon plugs) of interfaces 661 and 662. However, interfaces 661 and 662 can include any combination of the structures of the interfaces (e.g., interfaces 360, 460, and 560) described above. As an example, FIG. 6 shows interfaces 661 and 662 having plugs 621a and 621a', respectively. Plug 621a can be any plugs 321a (FIG. 3T and FIG. 4) and 521a (FIG. 5). Plug 621as can be any plugs 321a (FIG. 3T and FIG. 4) and 521a (FIG. 5).

Memory device 600 can include a pillar 630a and a conductive channel (e.g., channel structure) 644 to conduct current (e.g., electrons or holes) between conductive region 370 (e.g., part of a data line) and source material 309. Channel 644 can include part (or a combination) of the conductive structures of memory devices 300, 400, and 500. For example, channel 644 of memory device 600 can include a combination of conductive structure (e.g., channel structure) 334, part of plug 321a, and conductive structure (e.g., channel structure) 314 of memory device 300 (FIG. 3T) or memory device 400 (FIG. 4). In another example, channel 644 of memory device 600 can include a combination of conductive structure 334 (FIG. 5), part of plug 521a (FIG. 5), and conductive structure 314 (FIG. 5) of memory device 500 (FIG. 5).

In some structures of memory device 600, interface 661 can be any of interfaces 360 (FIG. 3T and FIG. 4) and 560 (FIG. 5), and interface 662 can be any of interfaces 360 (FIG. 3T and FIG. 4) and 560 (FIG. 5). However, in some structures of memory device 600, in order to improve operations (e.g., erase operations) of memory device 600, plug 621a' can be formed to match (e.g., to have the same doping concentration as) the material (e.g., N– doped polysilicon) as channel 644. Alternatively, plug 621a' can be omitted from (not formed in) memory device 600. In some structures of memory device 600 (e.g., if plug 621a is an N–doped polysilicon plug), matching the materials of plug 621a' and channel 344 (or alternatively omitting plug 621a' from memory device 600) allows holes during erase operations of memory device 600 to reach deck 302 without gate-induced drain-leakage (GIDL) current. In comparison with some conventional memory devices, memory device 600 can include similar improvements and benefits as memory devices 200 and 300 described above with reference to FIG. 2A through FIG. 3T.

The illustrations of the apparatuses (e.g., memory devices 100, 200, 300, 400, 500, and 600) and methods (e.g., processes described above with reference to FIG. 3A through FIG. 3T) are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 6 include apparatuses and methods of forming such apparatuses. One of the apparatus includes first memory cells located in different levels in a first portion of the apparatus, second memory cells located in different levels in a second portion of the apparatus, a switch located in a third portion of the apparatus between the first and second portions, first and second control gates to access the first and second memory cells, an additional control gate located between the first and second control gates to control the switch, a first conductive structure having a thickness and extending perpendicular to the levels in the first portion of the apparatus, a first dielectric structure between the first conductive structure and charge-storage portions of the first memory cells, a second dielectric structure having a second thickness between the second conductive structure and a sidewall of the additional control gate, the second thickness being greater than the first thickness. Other embodiments, including additional apparatuses and methods, are described.

In the detailed description and the claims, a list of items joined by the term "one of" can mean any of the listed items. For example, if items A and B are listed, then the phrase "one of A and B" means A only or B only. In another example, if items A, B, and C are listed, then the phrase "one of A, B and C" means A only; B only; or C only. Item A can include a single element or multiple elements. Item B can include a single element or multiple elements. Item C can include a single element or multiple elements.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description.

What is claimed is:

1. A method comprising:
   forming first conductor materials interleaved with first dielectric materials in a first portion of an apparatus;
   forming second conductor materials interleaved with second dielectric materials in a second portion of the apparatus;
   forming an opening through the first conductor materials and the first dielectric materials and through the second conductor materials and the second dielectric materials, such that the opening includes a first opening portion in the first portion of the apparatus and a second opening portion in the second portion of the apparatus;
   enlarging the second opening portion to form an enlarged opening portion and expose a sidewall of each of the second conductor materials at the enlarged opening portion and a sidewall of each of the second dielectric materials at the enlarged opening portion;
   forming memory cells in the first portion of the apparatus after the second opening portion is enlarged, such that each of the memory cells is located in a recess adjacent a sidewall of one of the first conductor materials; and
   forming switches in the second portion of apparatus, such that each of the switches includes a dielectric structure adjacent the sidewall of one of the second conductor materials.

2. The method of claim 1, wherein enlarging the second opening portion includes:
   removing a portion of each of the second dielectric materials at the second opening portion; and
   removing a portion of each of the second conductor materials at the second opening portion after the portion of each of the second dielectric materials is removed.

3. The method of claim 1, further comprising:
   forming an additional dielectric material over the second conductor materials and the second dielectric materials before the opening is formed, the second conductor materials and the second dielectric materials being between the additional dielectric material and the first conductor materials and the first dielectric materials, wherein forming the opening includes forming a third opening portion through the additional dielectric material; and removing a portion of the additional dielectric material before the memory cells are formed.

4. The method of claim 1, wherein the portion of the additional dielectric material is removed after the second opening portion is enlarged.

5. The method of claim 1, wherein forming the opening includes forming a hole going continuously through a portion of the first conductor materials, a portion of the first dielectric materials, a portion of the second conductor materials, and a portion of the second dielectric materials.

6. The method of claim 1, wherein the first and second conductor materials are formed such that the first and second conductor materials have a same vertical thickness.

7. The method of claim 1, wherein the first and second conductor materials are formed such that a vertical distance between first two adjacent conductive materials among the first and second conductor materials is the same as a vertical distance between second two adjacent conductive materials among the first and second conductor materials.

8. The method of claim 1, wherein the first and second conductor materials have a same conductivity type.

9. The method of claim 1, wherein the first and second conductor materials are formed such that:
a first conductive material of the second conductor materials forms a control gate of a first switch of the switches; and
a second conductive material of the second conductor materials forms a control gate of a second switch of the switches.

10. A method comprising:
forming first conductor materials interleaved with first dielectric materials in a first portion of an apparatus;
forming second conductor materials interleaved with second dielectric materials in a second portion of the apparatus;
forming an opening through the first conductor materials and the first dielectric materials and through the second conductor materials and the second dielectric materials, such that the opening exposes a sidewall of each of the first conductor materials at the opening and a sidewall of each of the second conductor materials at the opening;
forming a charge-storage portion in a recess adjacent the sidewall of a respective conductor material of first conductor materials;
forming a first conductive structure extending through the first conductor materials and the first dielectric materials;
forming a first dielectric structure between the first conductive structure and the charge-storage portion, the first dielectric structure having a first thickness in a direction from the first conductive structure to the sidewall of one of the first conductor materials;
forming a second conductive structure contacting the first conductive structure; and
forming a second dielectric structure between the second conductive structure and the sidewall of each of the second conductor materials, such that the second dielectric structure has a second thickness from the second conductive structure to the sidewall of one of the second conductor materials, and the second thickness is greater than the first thickness.

11. The method of claim 10, wherein the second conductive structure is formed after the first conducive structure is formed.

12. The method of claim 10, wherein the first dielectric structure and a portion of the second dielectric structure are concurrently formed.

13. The method of claim 10, wherein a portion of the second dielectric structure is formed before the first dielectric structure is formed.

14. A method comprising:
forming first conductor materials interleaved with first dielectric materials;
forming second conductor material interleaved with second dielectric materials;
forming a first opening through the first and second conductor materials and the first and second dielectric materials;
enlarging a portion of the first opening to form an enlarged portion of the first opening;
forming charge-storage portions in recesses adjacent sidewalls of the first conductor materials after enlarging the portion of the first opening;
forming a first dielectric structure adjacent the charge-storage portions;
forming a first channel structure adjacent the first dielectric structure;
forming a polysilicon plug in the enlarged portion of the first opening over the first channel structure;
forming an additional material in a second portion of the first opening over the polysilicon plug;
forming third conductor materials interleaved with third dielectric materials;
forming a second opening in the first and second conductor materials;
forming additional charge-storage portions in recesses adjacent sidewalk of the third conductor materials;
removing the additional material;
forming a third dielectric structure adjacent the additional charge-storage portions; and
forming a second channel structure adjacent the third dielectric structure and contacting the polysilicon plug.

15. The method of claim 14, further comprising:
forming an additional dielectric material over the second conductor materials and the second dielectric materials before the first opening is formed, wherein forming the first opening includes removing a portion of the additional material.

16. The method of claim 15, wherein enlarging the portion of the first opening includes:
removing a portion of each of the second dielectric materials at the portion of the first opening;
removing a portion of each of the second conductor materials at the portion of the first opening after removing the portion of each of the second dielectric materials; and
removing an additional portion of the additional dielectric material after removing the portion of each of the second conductor materials before forming charge-storage portions adjacent the first conductor materials.

17. The method of claim 14, wherein the first and second conductor materials have a same conductivity type.

18. The method of claim 14, wherein the polysilicon plug has a vertical thickness greater than a vertical thickness of each of the second conductor materials.

19. The method of claim 14, wherein the polysilicon plug is undoped polysilicon.

20. The method of claim 14, wherein the polysilicon plug is doped polysilicon.

\* \* \* \* \*